US008849446B2

(12) United States Patent
Nakata et al.

(10) Patent No.: US 8,849,446 B2
(45) Date of Patent: Sep. 30, 2014

(54) VACUUM PROCESSING APPARATUS AND PROGRAM

(75) Inventors: Teruo Nakata, Yokohama (JP); Hideaki Kondo, Kudamatsu (JP); Susumu Tauchi, Shunan (JP); Keita Nogi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 568 days.

(21) Appl. No.: 13/021,898

(22) Filed: Feb. 7, 2011

(65) Prior Publication Data

US 2011/0217148 A1  Sep. 8, 2011

(30) Foreign Application Priority Data

Mar. 2, 2010  (JP) ................. 2010-045522

(51) Int. Cl.
*G06F 7/00* (2006.01)
*H01L 21/677* (2006.01)

(52) U.S. Cl.
CPC .................. *H01L 21/677* (2013.01)
USPC ............ 700/218; 700/121; 29/25.01; 355/53

(58) Field of Classification Search
USPC .......................................... 700/218
See application file for complete search history.

(56) References Cited

U.S. PATENT DOCUMENTS

| 6,099,598 | A | 8/2000 | Yokoyama et al. | |
| 6,224,638 | B1* | 5/2001 | Jevtic et al. | 29/25.01 |
| 6,844,917 | B2* | 1/2005 | Yoshida | 355/53 |
| 8,538,573 | B2* | 9/2013 | Nakata et al. | 700/121 |
| 8,655,472 | B2* | 2/2014 | Koizumi et al. | 700/121 |
| 2001/0011198 | A1* | 8/2001 | Jevtic | 700/100 |
| 2004/0029300 | A1 | 2/2004 | Iijima et al. | |
| 2004/0240971 | A1* | 12/2004 | Tezuka et al. | 414/217 |
| 2008/0085173 | A1* | 4/2008 | van der Meulen | 414/222.07 |
| 2009/0053016 | A1 | 2/2009 | van der Meulen | |

FOREIGN PATENT DOCUMENTS

| JP | 10-189687 | 7/1998 |
| JP | 2005-019960 | 1/2005 |
| JP | 2005-175455 | 6/2005 |
| JP | 2006-005047 | 1/2006 |
| JP | 2007-511104 | 4/2007 |
| JP | 2009-206345 | 9/2009 |
| KR | 10-2003-0057575 | 7/2003 |
| WO | WO 02/47153 | 6/2002 |

* cited by examiner

*Primary Examiner* — Gene Crawford
*Assistant Examiner* — Kyle Logan
(74) *Attorney, Agent, or Firm* — Antonelli, Terry, Stout & Kraus, LLP.

(57) ABSTRACT

The present invention provides an efficient transferring control method in a vacuum processing apparatus of a linear tool in which plural vacuum robots are arranged in transferring mechanical units to which process chambers are connected and processing-target members are passed and received among the plural vacuum robots. In addition, the present invention provides a vacuum processing apparatus in which there are provided plural controlling methods, and a unit which determines whether rates of the transferring robots are to be controlled or rates of the process chambers are to be controlled on the basis of processing time of each processing-target member and switches the controlling method in accordance with a site whose rate is controlled.

8 Claims, 24 Drawing Sheets

FIG. 5

| OPERATION OF VACUUM ROBOT 217 | OPERATION TIME | ACCUMULATED OPERATION TIME | |
|---|---|---|---|
| LOAD LOCK → PROCESS CHAMBER | 5 | 5 | |
| WAFER REPLACEMENT IN PROCESS CHAMBER | 10 | 15 | |
| PROCESS CHAMBER → LOAD LOCK | 5 | 20 | |
| WAFER REPLACEMENT IN LOAD LOCK | 5 | 25 | |
| LOAD LOCK → PROCESS CHAMBER | 5 | 30 | |
| WAFER REPLACEMENT IN PROCESS CHAMBER | 10 | 40 | |
| PROCESS CHAMBER → LOAD LOCK | 5 | 45 | |
| WAFER REPLACEMENT IN LOAD LOCK | 5 | 50 | |
| LOAD LOCK → BUFFER ROOM | 5 | 55 | |
| WAFER REPLACEMENT IN BUFFER ROOM | 5 | 60 | CYCLE TIME |
| BUFFER ROOM → LOAD LOCK | 5 | 65 | |
| WAFER REPLACEMENT IN LOAD LOCK | 5 | 70 | |
| LOAD LOCK → BUFFER ROOM | 5 | 75 | |
| WAFER REPLACEMENT IN BUFFER ROOM | 5 | 80 | |
| BUFFER ROOM → LOAD LOCK | 5 | 85 | |
| WAFER REPLACEMENT IN LOAD LOCK | 5 | 90 | |
| LOAD LOCK → BUFFER ROOM | 5 | 95 | |
| WAFER REPLACEMENT IN BUFFER ROOM | 5 | 100 | |
| BUFFER ROOM → LOAD LOCK | 5 | 105 | |
| WAFER REPLACEMENT IN LOAD LOCK | 5 | 110 | |
| LOAD LOCK → BUFFER ROOM | 5 | 115 | |
| WAFER REPLACEMENT IN BUFFER ROOM | 5 | 120 | |
| BUFFER ROOM → LOAD LOCK | 5 | 125 | |
| WAFER REPLACEMENT IN LOAD LOCK | 5 | 130 | |

FIG. 11

| OPERATION INSTRUCTION | OPERATION INSTRUCTION CONDITION |
|---|---|
| TRANSFERRING FROM LOAD LOCK 211 TO PROCESS CHAMBER 205 | UNPROCESSED WAFER TO BE CARRIED TO PROCESS CHAMBER 205 IS PRESENT IN LOAD LOCK 211 AND LOAD LOCK 211 IS IN VACUUM STATUS |
| | PROCESS CHAMBER 205 IS IN STANDBY STATUS |
| | AT LEAST ONE HAND OF VACUUM ROBOT 217 IS IN STANDBY STATUS |
| TRANSFERRING FROM LOAD LOCK 211 TO BUFFER ROOM 212 | UNPROCESSED WAFER TO BE CARRIED TO OTHER THAN PROCESS CHAMBERS 205 AND 206 IS PRESENT IN LOAD LOCK 211 AND LOAD LOCK 211 IS IN VACUUM STATUS |
| | AVAILABLE STAGE IS PRESENT IN BUFFER ROOM 212 |
| | AT LEAST ONE HAND OF VACUUM ROBOT 217 IS IN STANDBY STATUS |
| TRANSFERRING FROM PROCESS CHAMBER 205 TO LOAD LOCK 211 | PROCESSED WAFER IS PRESENT IN PROCESS CHAMBER 205 |
| | AVAILABLE STAGE IS PRESENT IN LOAD LOCK 211 AND LOAD LOCK 211 IS IN VACUUM STATUS |
| | AT LEAST ONE HAND OF VACUUM ROBOT 217 IS IN STANDBY STATUS |
| ... | ... |

FIG. 15

| OPERATION INSTRUCTION | OPERATION INSTRUCTION CONDITION |
|---|---|
| TRANSFERRING FROM LOAD LOCK 211 TO PROCESS CHAMBER 205 | UNPROCESSED WAFER IS PRESENT IN LOAD LOCK 211 AND LOAD LOCK 211 IS IN VACUUM STATUS |
| | PROCESS CHAMBER 205 IS IN STANDBY STATUS |
| | AT LEAST ONE HAND OF VACUUM ROBOT 217 IS IN STANDBY STATUS |
| | THE NUMBER OF UNPROCESSED WAFERS IN BUFFER ROOM 212 IS LARGER THAN THAT IN LOAD LOCK 211 |
| TRANSFERRING FROM LOAD LOCK 211 TO BUFFER ROOM 212 | UNPROCESSED WAFER IS PRESENT IN LOAD LOCK 211 AND LOAD LOCK 211 IS IN VACUUM STATUS |
| | AVAILABLE STAGE IS PRESENT IN BUFFER ROOM 212 |
| | AT LEAST ONE HAND OF VACUUM ROBOT 217 IS IN STANDBY STATUS |
| TRANSFERRING FROM BUFFER ROOM 212 TO PROCESS CHAMBER 207 | PROCESSED WAFER IS PRESENT IN BUFFER ROOM 212 |
| | PROCESS CHAMBER 207 IS IN STANDBY STATUS |
| | AT LEAST ONE HAND OF VACUUM ROBOT 218 IS IN STANDBY STATUS |
| | THE NUMBER OF UNPROCESSED WAFERS IN BUFFER ROOM 213 IS LARGER THAN THAT IN BUFFER ROOM 212 |
| TRANSFERRING FROM BUFFER ROOM 212 TO BUFFER ROOM 213 | UNPROCESSED WAFER IS PRESENT IN BUFFER ROOM 211 |
| | AVAILABLE STAGE IS PRESENT IN BUFFER ROOM 213 |
| | AT LEAST ONE HAND OF VACUUM ROBOT 218 IS IN STANDBY STATUS |
| ... | ... |

FIG. 16

| OPERATION INSTRUCTION | OPERATION INSTRUCTION CONDITION |
|---|---|
| TRANSFERRING FROM LOAD LOCK 211 TO PROCESS CHAMBER 205 | UNPROCESSED WAFER IS PRESENT IN LOAD LOCK 211 AND LOAD LOCK 211 IS IN VACUUM STATUS |
| | PROCESS CHAMBER 205 IS IN STANDBY STATUS |
| | AT LEAST ONE HAND OF VACUUM ROBOT 217 IS IN STANDBY STATUS |
| TRANSFERRING FROM LOAD LOCK 211 TO BUFFER ROOM 212 | UNPROCESSED WAFER IS PRESENT IN LOAD LOCK 211 AND LOAD LOCK 211 IS IN VACUUM STATUS |
| | AVAILABLE STAGE IS PRESENT IN BUFFER ROOM 212 |
| | AT LEAST ONE HAND OF VACUUM ROBOT 217 IS IN STANDBY STATUS |
| | THE NUMBER OF UNPROCESSED WAFERS IS 3 OR SMALLER IN BUFFER ROOM 212 |
| TRANSFERRING FROM PROCESS CHAMBER 205 TO LOAD LOCK 211 | PROCESSED WAFER IS PRESENT IN PROCESS CHAMBER 205 |
| | AVAILABLE STAGE IS PRESENT IN LOAD LOCK 211 AND LOAD LOCK 211 IS IN VACUUM STATUS |
| | AT LEAST ONE HAND OF VACUUM ROBOT 217 IS IN STANDBY STATUS |
| ... | ... |

FIG. 18

| SITE | STATUS | WAFER NUMBER | WAFER STATUS |
|---|---|---|---|
| FOUP 201_STAGE 1 | — | W1 | PROCESSED |
| FOUP 201_STAGE 2 | — | EMPTY | — |
| ⋮ | ⋮ | ⋮ | ⋮ |
| FOUP 201_STAGE 25 | — | W25 | UNPROCESSED |
| FOUP 202_STAGE 1 | — | W26 | UNPROCESSED |
| ⋮ | ⋮ | ⋮ | ⋮ |
| FOUP 202_STAGE 25 | — | W50 | UNPROCESSED |
| ATMOSPHERIC ROBOT 203 | BEING CARRIED | W12 | UNPROCESSED |
| LOAD LOCK 211_STAGE 1 | VACUUM | W11 | UNPROCESSED |
| ⋮ | ⋮ | ⋮ | ⋮ |
| LOAD LOCK 211_STAGE 5 | VACUUM | W2 | PROCESSED |
| PROCESS CHAMBER 205 | BEING PROCESSED | W5 | BEING PROCESSED |
| PROCESS CHAMBER 206 | CLEANING | EMPTY | — |
| ⋮ | ⋮ | ⋮ | ⋮ |
| PROCESS CHAMBER 210 | STANDBY | EMPTY | — |
| VACUUM ROBOT 217_HAND 1 | STANDBY | EMPTY | — |
| VACUUM ROBOT 217_HAND 2 | BEING CARRIED | W3 | PROCESSED |
| VACUUM ROBOT 218_HAND 1 | BEING CARRIED | W8 | UNPROCESSED |
| VACUUM ROBOT 218_HAND 2 | BEING CARRIED | W7 | UNPROCESSED |
| VACUUM ROBOT 219_HAND 1 | STANDBY | EMPTY | — |
| VACUUM ROBOT 219_HAND 2 | STANDBY | EMPTY | — |
| BUFFER ROOM 212_STAGE 1 | — | W4 | PROCESSED |
| ⋮ | ⋮ | ⋮ | ⋮ |
| BUFFER ROOM 212_STAGE 5 | — | EMPTY | — |
| BUFFER ROOM 213_STAGE 1 | — | W6 | UNPROCESSED |
| ⋮ | ⋮ | ⋮ | ⋮ |
| BUFFER ROOM 213_STAGE 5 | — | EMPTY | — |

FIG. 19

| SITE IN CHARGE OF CARRYING | CARRYING TARGET | SENDER | DESTINATION |
|---|---|---|---|
| HAND 1 OF VACUUM ROBOT 217 | W10 | LOAD LOCK 211_STAGE 1 | BUFFER ROOM 212_STAGE 5 |
| HAND 1 OF VACUUM ROBOT 219 | W6 | BUFFER ROOM 213_STAGE 1 | PROCESS CHAMBER 210 |

FIG. 20

| WAFER NUMBER | DESTINATION |
|---|---|
| W1 | PROCESS CHAMBER 205 |
| W2 | PROCESS CHAMBER 207 |
| W3 | PROCESS CHAMBER 206 |
| W4 | PROCESS CHAMBER 209 |
| W5 | PROCESS CHAMBER 205 |
| W6 | PROCESS CHAMBER 208 |
| W7 | PROCESS CHAMBER 206 |
| . | . |
| . | . |
| . | . |
| W22 | PROCESS CHAMBER 210 |
| W23 | PROCESS CHAMBER 209 |
| W24 | PROCESS CHAMBER 210 |
| W25 | PROCESS CHAMBER 209 |

FIG. 21

| OPERATION ORDER | SITE | OPERATION |
|---|---|---|
| 1 | LOAD LOCK 211 | OPEN VACUUM-SIDE GATE VALVE 221 |
| 1 | VACUUM ROBOT 217 | PIVOT TO FACE THE DIRECTION OF LOAD LOCK 211 |
| 2 | VACUUM ROBOT 217 | TAKE WAFER OUT OF LOAD LOCK 211 |
| 3 | VACUUM ROBOT 217 | PIVOT TO FACE THE DIRECTION OF BUFFER ROOM 212 |
| 3 | BUFFER ROOM 212 | OPEN GATE VALVE 224 ON THE SIDE OF TRANSPORT CHAMBER 214 |
| 3 | LOAD LOCK 211 | CLOSE VACUUM-SIDE GATE VALVE 221 |
| 4 | VACUUM ROBOT 217 | PLACE WAFER IN BUFFER ROOM 212 |
| 5 | BUFFER ROOM 212 | CLOSE GATE VALVE 224 ON THE SIDE OF TRANSPORT CHAMBER 214 |

FIG. 22

| WAFER NUMBER | PROCESSING TIME |
|---|---|
| W1 | 40 |
| W2 | 40 |
| W3 | 40 |
| W4 | 40 |
| W5 | 40 |
| W6 | 40 |
| W7 | 40 |
| . | . |
| . | . |
| . | . |
| W22 | 40 |
| W23 | 40 |
| W24 | 40 |
| W25 | 40 |

FIG. 23

| CONNECTION SITE 1 | CONNECTION SITE 2 |
|---|---|
| ATMOSPHERIC-SIDE BLOCK 232 | LOAD LOCK 211 |
| LOAD LOCK 211 | TRANSPORT CHAMBER 214 |
| TRANSPORT CHAMBER 214 | BUFFER ROOM 212 |
| TRANSPORT CHAMBER 214 | PROCESS CHAMBER 205 |
| TRANSPORT CHAMBER 214 | PROCESS CHAMBER 206 |
| BUFFER ROOM 212 | TRANSPORT CHAMBER 215 |
| TRANSPORT CHAMBER 215 | BUFFER ROOM 213 |
| TRANSPORT CHAMBER 215 | PROCESS CHAMBER 207 |
| TRANSPORT CHAMBER 215 | PROCESS CHAMBER 208 |
| BUFFER ROOM 213 | TRANSPORT CHAMBER 216 |
| TRANSPORT CHAMBER 216 | PROCESS CHAMBER 209 |
| TRANSPORT CHAMBER 216 | PROCESS CHAMBER 210 |

FIG. 24

| CONTROLLING MODE | SELECTION |
|---|---|
| ROBOT HIGH-PERFORMANCE MODE | ○ |
| PROCESS CHAMBER HIGH-PERFORMANCE MODE | |

FIG. 25

| THE NUMBER OF PROCESS CHAMBERS | THRESHOLD VALUE |
|---|---|
| 6 | 120 |

FIG. 26

| TRANSFERRING ROBOT | TRANSFERRING OPERATION | OPERATION TIME |
|---|---|---|
| TRANSFERRING ROBOT 217 | LOAD LOCK → PROCESS CHAMBER | 5 |
| TRANSFERRING ROBOT 217 | PROCESS CHAMBER → LOAD LOCK | 5 |
| TRANSFERRING ROBOT 217 | LOAD LOCK → BUFFER ROOM | 5 |
| TRANSFERRING ROBOT 217 | BUFFER ROOM → LOAD LOCK | 5 |
| TRANSFERRING ROBOT 217 | WAFER REPLACEMENT IN LOAD LOCK | 5 |
| TRANSFERRING ROBOT 217 | WAFER REPLACEMENT IN PROCESS CHAMBER | 10 |
| TRANSFERRING ROBOT 217 | WAFER REPLACEMENT IN BUFFER ROOM | 5 |
| TRANSFERRING ROBOT 218 | BUFFER ROOM → PROCESS CHAMBER | 5 |
| TRANSFERRING ROBOT 218 | PROCESS CHAMBER → BUFFER ROOM | 5 |
| TRANSFERRING ROBOT 218 | BUFFER ROOM → BUFFER ROOM | 5 |
| TRANSFERRING ROBOT 218 | BUFFER ROOM → BUFFER ROOM | 5 |
| TRANSFERRING ROBOT 218 | WAFER REPLACEMENT IN PROCESS CHAMBER | 10 |
| TRANSFERRING ROBOT 218 | WAFER REPLACEMENT IN BUFFER ROOM | 5 |
| TRANSFERRING ROBOT 219 | BUFFER ROOM → PROCESS CHAMBER | 5 |
| TRANSFERRING ROBOT 219 | PROCESS CHAMBER → BUFFER ROOM | 5 |
| TRANSFERRING ROBOT 219 | WAFER REPLACEMENT IN PROCESS CHAMBER | 10 |
| TRANSFERRING ROBOT 219 | WAFER REPLACEMENT IN BUFFER ROOM | 5 |

FIG. 27

| TRANSFERRING ROBOT | ARRANGED SITE | ROBOT TYPE |
|---|---|---|
| ATMOSPHERIC ROBOT 203 | ATMOSPHERIC-SIDE BLOCK 232 | TYPE A |
| VACUUM ROBOT 217 | TRNSPORT CHAMBER 214 | TYPE B |
| VACUUM ROBOT 218 | TRNSPORT CHAMBER 215 | TYPE B |
| VACUUM ROBOT 219 | TRNSPORT CHAMBER 216 | TYPE B |

VACUUM PROCESSING APPARATUS AND PROGRAM

CLAIM OF PRIORITY

The present application claims priority from Japanese patent application JP 2010-045522 filed on Mar. 2, 2010, the content of which is hereby incorporated by reference into this application.

BACKGROUND OF THE INVENTION

1. Field of the Invention

The present invention relates to a method of transferring semiconductor processing-target members (hereinafter, referred to as "wafers") among process chambers of a semiconductor processing apparatus.

2. Description of the Related Arts

In a semiconductor processing apparatus, especially, an apparatus in which a processing target is processed in a pressure-reduced state, it has been demanded to improve the efficiency of a process of a wafer that is a processing target as well as finely-tuned and accurate processes. Therefore, there has been recently developed a multi-chamber apparatus in which plural process chambers are provided while being connected in order to enhance the efficiency of productivity per installation area for a clean room. In such an apparatus in which the plural process chambers are provided for processing, the pressure of a gas in each process chamber can be reduced, and the process chambers are connected to transport chambers in which robots for transferring wafers are provided.

Among the multi-chamber apparatuses, an apparatus having a structure called as a cluster tool in which process chambers are radially connected around transport chambers has been widely spread. However, the apparatus of the cluster tool requires a large installation area. Especially, the apparatus involves a problem that the installation area becomes much larger along with a large diameter of a wafer in recent years. In order to solve the problem, an apparatus having a structure called as a linear tool has appeared (for example, refer to Japanese Patent Application Laid-Open No. 2007-511104).

The structure of the linear tool is characterized in that plural transport chambers are provided, process chambers are connected to the respective transport chambers, and the transport chambers are directly connected to each other or connected to each other while interposing spaces (hereinafter, referred to as "buffer rooms") therebetween to pass and receive wafers.

The structure of the linear tool has been proposed to reduce the installation area as described above. On the other hand, some proposals in terms of improvement of productivity have been made. In order to improve productivity, it is important to reduce the processing time and to efficiently carry wafers. Especially, some proposals have been made in terms of efficient transferring methods. As a representative method, there has been known a scheduling method. In the scheduling method, transferring operations are determined in advance, and wafers are transferred on the basis of the transferring operations. As an example of determining the transferring operations, there has been proposed a method in which wafers are allocated to the process chambers as destinations in the order of process completion time from the fastest process chamber, and the transferring operations are determined (refer to Japanese Patent Application Laid-Open Publication No. 10-189687).

SUMMARY OF THE INVENTION

The above-described related art involves the following problems.

The linear tool is characterized in that the plural transport chambers are provided, the respective transport chambers carry the wafers to the process chambers, and the wafers are passed and received among the transport chambers. In addition, the transferring operation of the linear tool is characterized in that when the wafers are transferred to the process chambers, the number of wafers to be passed and received among the transport chambers differs depending on the positions of the transport chambers to which the process chambers are connected. The characteristics are different from those of the cluster tool.

However, the efficient transferring methods that have been proposed from the past are adapted for the transferring characteristics of the cluster tool, the transferring characteristics of the linear tool are not taken into account, and the transferring methods are not necessarily efficient.

Further, the efficient transferring methods differ depending on a processing step of wafers in some cases. There are processing steps which are completed through a single process in the process chambers and other processing steps which are completed through plural processes in the process chambers. Further, the efficient transferring methods differ depending on operation conditions in some cases. There are operation conditions under which the same kinds of wafers are continuously processed, and other operation conditions under which different kinds of wafers are processed in parallel.

Among these, the processing steps which are completed through a single process in the process chambers and the operation conditions under which the same kinds of wafers are continuously processed are used in many cases.

The present invention provides an efficient transferring method in processing steps which are completed through a single process in the process chambers under operation conditions that the same kinds of wafers are continuously processed in the linear tool. Here, the same kinds of wafers mean a group of wafers having substantially the same processing time.

In order to solve the above-described problem, the present invention provides a vacuum processing apparatus including: process chambers in which predetermined processes are performed for processing-target members; transferring mechanical units including vacuum robots which pass and receive the processing-target members; transferring intermediate units through which the transferring mechanical units are connected to each other and which relay and carry the processing-target members; and a controlling unit which controls passing, receiving, relaying, and transferring of the processing-target members, wherein the controlling unit has a unit for determining methods of transferring the processing-target members to the process chambers and the transferring intermediate units on the basis of time required for the process chambers to process the processing-target members in the process chambers.

In addition, the present invention provides a storage medium readable by a computer causing a computation processing apparatus to function as: processing units which perform predetermined processes for processing-target members in process chambers; transferring units which pass and carry the processing-target members using transferring robots; transferring intermediate units through which the transferring units are connected to each other and which relay and carry the processing-target members; a controlling unit which controls passing, receiving, relaying, and transferring of the processing-target members; and a unit which determines methods of transferring the processing-target members to the process chambers and the transferring intermediate units on the basis of time required for the process chambers to process the processing-target members in the process chambers.

According to the present invention, it is possible to provide a semiconductor processing apparatus which is high in transferring efficiency and throughput by switching a transferring controlling method in accordance with the processing time of a processing-target wafer to increase the operation rates of rate-controlled sites.

BRIEF DESCRIPTION OF THE DRAWINGS

FIG. 5 is a diagram for showing an example of transferring operations and operation cycle calculation;

FIG. 11 is a diagram for showing an example of an operation instruction rule in the first embodiment;

FIG. 15 is a diagram for showing an example of the operation instruction rule in the robot high-performance mode in the second embodiment;

FIG. 16 is a diagram for showing an example of the operation instruction rule in the process chamber high-performance mode in the second embodiment;

FIG. 18 is a diagram for showing an example of apparatus status information;

FIG. 19 is a diagram for showing an example of operation instruction information;

FIG. 20 is a diagram for showing an example of destination information;

FIG. 21 is a diagram for showing an example of operation sequence information;

FIG. 22 is a diagram for showing an example of processing-target information;

FIG. 23 is a diagram for showing an example of site connection information;

FIG. 24 is a diagram for showing an example of controlling mode information;

FIG. 25 is a diagram for showing an example of switching threshold value information;

FIG. 26 is a diagram for showing an example of operation time information;

FIG. 27 is a diagram for showing an example of transferring robot information;

DETAILED DESCRIPTION OF THE PREFERRED EMBODIMENTS

Figure 1:
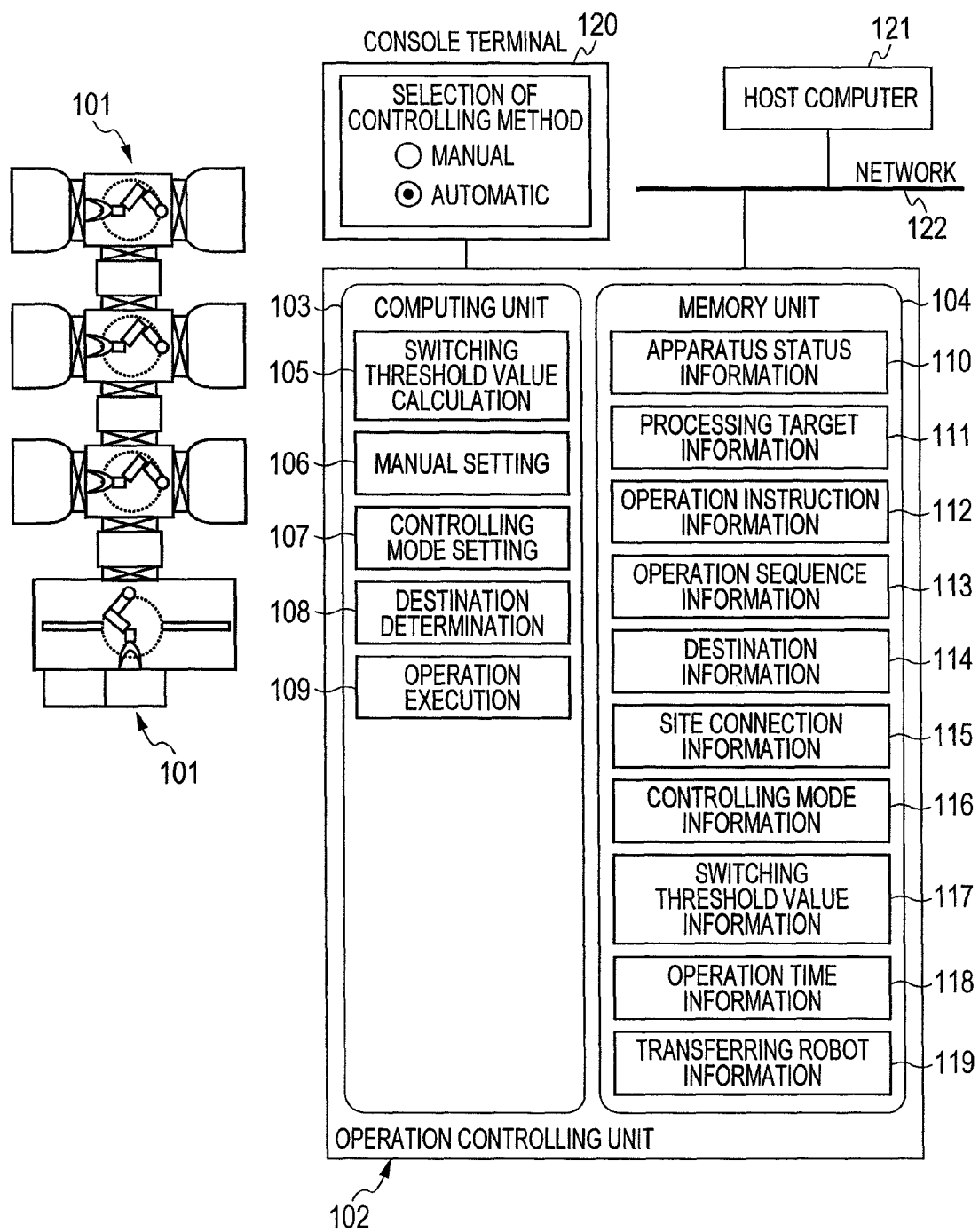
FIG. 1 is a diagram for explaining an outline of the entire configuration of a semiconductor processing apparatus.

Hereinafter, embodiments of the present invention will be described using the drawings.

First Embodiment

First, a first embodiment will be described.
(Entire Configuration)

An outline of the entire configuration of a semiconductor processing apparatus according to the present invention will be described using FIG. 1. The semiconductor processing apparatus is roughly divided into process chambers and transferring mechanisms 101, an operation controlling unit 102, and a console terminal 120.

The process chambers and transferring mechanisms 101 include process chambers in each of which processes such as etching and film formation on a wafer can be performed and transferring mechanisms, each including a robot for transferring the wafer.

The operation controlling unit 102 is a controller which controls operations of the process chambers and the transferring mechanisms, and includes a computing unit 103 for performing a computing process and a memory unit 104 which stores various information.

The computing unit 103 includes a switching threshold value calculation process 105 which calculates a threshold value of a processing time used when determining whether or not to switch the control of a transferring operation, a manual setting process 106 which performs a computing process when a user manually manipulates, a controlling mode setting process 107 which determines whether or not to switch the control of a transferring operation, a destination determination process 108 which automatically determines the destination of the wafer, and an operation execution process 109 which computes to allow the process chambers and the transferring mechanisms to actually operate.

In addition, the memory unit 104 stores apparatus status information 110, processing-target information 111, operation instruction information 112, operation sequence information 113, destination information 114, site connection information 115, controlling mode information 116, switching threshold value information 117, and operation time information 118.

The console terminal 120 is used by a user to input a controlling method and to confirm the status of the apparatus, and is provided with input devices such as a key board, a mouse, and a touch pen and a screen for outputting information.

Further, the semiconductor processing apparatus is connected to a host computer 121 through a network 122, and information can be downloaded from the host computer 121 when the information is necessary.

Figure 2:
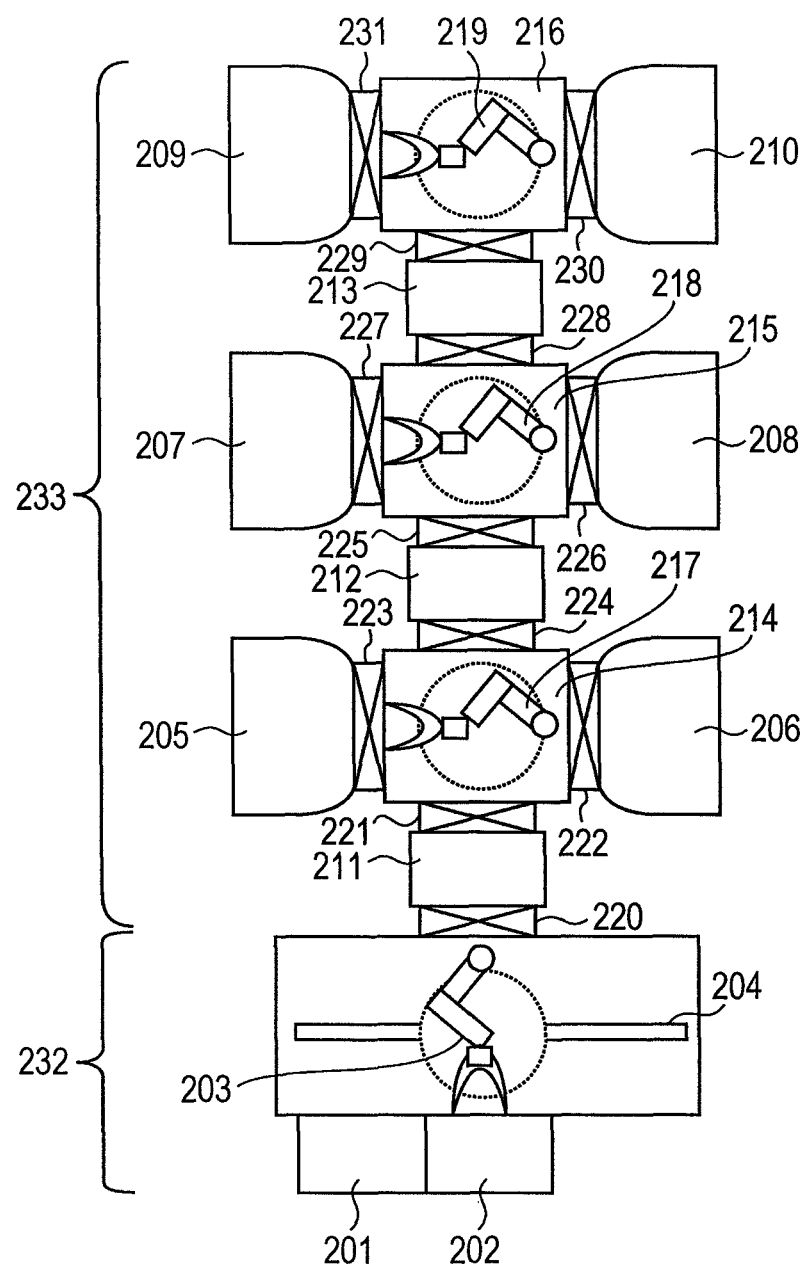
FIG. 2 is a diagram for explaining configurations of process chambers and transferring mechanisms.

Next, configurations of the process chambers and the transferring mechanisms will be described using FIG. 2.

The process chambers and the transferring mechanisms are roughly divided into an atmospheric-side block 232 and a vacuum-side block 233. The atmospheric-side block 232 performs transferring operations of wafers such as taking or storing the wafers out of/into a cassette that stores the wafers under the atmospheric pressure.

The vacuum-side block 233 carries the wafers under a pressure reduced from the atmospheric pressure, and processes the wafers in the vacuum process chambers. A load lock 211 is provided between the atmospheric-side block 232 and the vacuum-side block 233 to increase or decrease a pressure between the atmospheric pressure and the vacuum pressure in a state where the wafer is held inside.

FOUP (Front-Opening Unified Pod)s 201 and 202, and an atmospheric robot 203 are provided in the atmospheric-side block 232. The cassettes that store the processing-target wafers are placed in the FOUPs 201 and 202. The atmospheric robot 203 having hands capable of holding the wafer takes out the wafer stored in the cassette to be transferred to the load lock 211. On the contrary, the atmospheric robot 203 takes the wafer out of the load lock 211 to be stored into the cassette.

The atmospheric robot 203 is capable of allowing robot arms to elongate and contract, to move upward and downward, and to pivot. Further, the atmospheric robot 203 can horizontally move on a rail 204. It should be noted that the atmospheric-side block 232 is an example, and the present invention is not limited to the apparatus having two FOUPs, but may be an apparatus having more than or less than two FOUPs. In addition, the present invention is not limited to the apparatus having one atmospheric robot, but may be an apparatus having plural atmospheric robots. Further, the present invention may be an apparatus having a mechanism for positioning a wafer, which will not be described in the embodiment.

The vacuum-side block 233 includes process chambers 205, 206, 207, 208, 209, and 210, transport chambers 214, 215, and 216, and buffer rooms 212 and 213. Each of the process chambers 205, 206, 207, 208, 209, and 210 is a site in which processes such as etching and film formation on a wafer are performed. The process chambers are connected to the transport chambers 214, 215, and 216 through gate valves 222, 223, 226, 227, 230, and 231. Each of the gate valves 222, 223, 226, 227, 230, and 231 has opening and closing valves with which a space in each process chamber and a space in each transport chamber can be sectioned from each other or connected to each other. Vacuum robots 217, 218, and 219 are provided in the transport chambers 214, 215, and 216, respectively.

Each of the vacuum robots 217, 218, and 219 has two robot hands capable of holding the wafers, and is capable of allowing the robot arms to elongate and contract, to pivot, and to move upward and downward. In addition, the robot arms can carry the wafers to the load lock, the process chambers, or the buffer rooms.

The buffer rooms 212 and 213 are connected between the transport chambers 214, 215, and 216, and have mechanisms for holding plural wafers. The vacuum robots 217, 218, and 219 place or take the wafers in/out of the buffer rooms 212 and 213, so that the wafers can be passed and received among the transport chambers. The buffer rooms 212 and 213 are connected to the transport chambers 214, 215, and 216 through gate valves 224, 225, 228, and 229.

Each of the gate valves 224, 225, 228, and 229 has opening and closing valves with which a space in each transport chamber and a space in each buffer room can be sectioned from each other or connected to each other. It should be noted that the vacuum-side block 233 is an example, and the present invention is not limited to the apparatus having six process chambers, but may be an apparatus having more than or less than six process chambers. Further, the apparatus in which two process chambers are connected to one transport chamber will be described in the embodiment. However, the present invention is not limited to the apparatus in which two process chambers are connected to one transport chamber, but may be an apparatus in which one process chamber is connected to one transport chamber or three or more process chambers are connected to one transport chamber. In addition, the present invention is not limited to the apparatus having three transport chambers, but may be an apparatus having more than or less than three transport chambers. Further, the apparatus in which the gate valves are provided between the transport chambers and the buffer rooms will be described in the embodiment. However, the gate valves may be omitted.

The load lock 211 is connected to the atmospheric-side block 232 and the vacuum-side block 233 through gate valves 220 and 221, respectively, and can increase or decrease a pressure between the atmospheric pressure and the vacuum pressure in a state where the wafer is held inside. Further, the load lock 211 has a mechanism for holding plural wafers.

Next, an operation controlling system of the semiconductor processing apparatus will be described.

In such a semiconductor processing apparatus, a site whose rate is controlled is determined depending on the length of the processing time for a processing target. In the case where the processing time is sufficiently short, the operations of transferring the wafers to the process chambers by the vacuum robots fall behind, and the rates of the vacuum robots are controlled. On the other hand, in the case where the processing time is sufficiently long, the operations of transferring the wafers to the process chambers by the vacuum robots are performed in time, and thus the vacuum robots wait until the processes in the process chambers are completed. In other words, the rates of the process chambers are controlled.

Here, an effective transferring operation that is an object of the present invention means that the operation rates of the sites whose rates are controlled are increased. Accordingly, it is necessary to provide a transferring controlling unit to increase the operation rates of the sites whose rates are controlled as high as possible. In the case where the rates of the vacuum robots are controlled, it is only necessary to control the apparatus in such a manner that the vacuum robots repeat the transferring operations in order to prevent the vacuum robots from waiting.

On the other hand, in the case where the rates of the process chambers are controlled, it is only necessary to control the apparatus in such a manner that the wafers are transferred to the process chambers one after another in order to prevent the process chambers from waiting.

A conventional cluster tool has one vacuum robot which carries the wafers to the process chambers. The operation of repeating the transferring operation in order to prevent the vacuum robot from waiting and the operation of transferring the wafers to the process chambers one after another in order to prevent the process chambers from waiting can be performed under the same control. Specifically, if the vacuum robot is controlled to sequentially carry the wafers to the plural process chambers so as to equalize the number of times of transferring operations to each process chamber, the vacuum robot can be operated with less waiting time when the processing time is sufficiently short. In addition, when the processing time is sufficiently long, the process chambers can be operated with less waiting time because the wafers are sequentially transferred to the process chambers in which the processes have been completed.

However, a linear tool has plural vacuum robots which carry the wafers to the process chambers, and the wafers are passed and received among the vacuum robots. Thus, the operation of reducing the waiting time of the vacuum robots is different from the operation of reducing the waiting time of the process chambers.

As characteristics of the linear tool, there is a transport chamber connected adjacent to the load lock, whereas there is another transport chamber connected to the load lock through different transport chambers. Thus, the connection relations between the load lock and the transport chambers differ depending on the transport chambers. Specifically, some transport chambers are located near the load lock, and other transport chambers are located distant from the load lock.

The transferring operations of the vacuum robots installed in the transport chambers differ due to the characteristics. For example, in the case where the wafer is transferred to the process chamber connected the transport chamber located near the load lock, the wafer is not transferred to the transport chamber located distant from the load lock. Thus, the vacuum robot of the transport chamber located distant from the load lock does not carry the wafer. However, in the case where the wafer is transferred to the process chamber connected to the transport chamber located distant from the load lock, the wafer passes through the transport chamber located near the load lock, and thus the robot of the transport chamber located near the load lock also carries the wafer.

Accordingly, the number of wafers to be transferred by the vacuum robot of the transport chamber located near the load lock becomes larger than that by the vacuum robot of the transport chamber located distant from the load lock. Namely, the vacuum robot of the transport chamber located near the load lock becomes busier. In other words, the vacuum robot of the transport chamber located distant from the load lock is likely to wait for a long time.

Further, between the time required to carry the wafer to the process chamber and the time required to carry the wafer from the transport chamber to the adjacent one, the former is longer. In consideration of the characteristics and those in which the vacuum robot of the transport chamber located distant from the load lock is likely to wait for a long time, if the apparatus is controlled in such a manner that the number of wafer transferring operations to the process chambers is increased for the vacuum robot located further away from the load lock, and the number of wafer transferring operations to the process chambers is decreased for the vacuum robot located nearer the load lock, busyness of all vacuum robots can be made equal. Namely, the waiting time of each vacuum robot can be shortened, and the operation rates of the vacuum robots can be increased.

On the other hand, in order to increase the operation rates of the process chambers, it is only necessary to control the apparatus in such a manner that the vacuum robots sequentially carry the wafers to the plural process chambers so as to equalize the number of times of transferring operations to each process chamber. Thereby, the wafers are sequentially transferred to the process chambers in which the processes have been completed, and the operation rates of the process chambers are increased.

Accordingly, a controlling method of switching transferring control by determining whether the rates of the vacuum robots are to be controlled or the rates of the process chambers are to be controlled is proposed in order to improve the transferring efficiency. Hereinafter, the controlling method will be described.

(Operation Controlling System)

Figure 3:
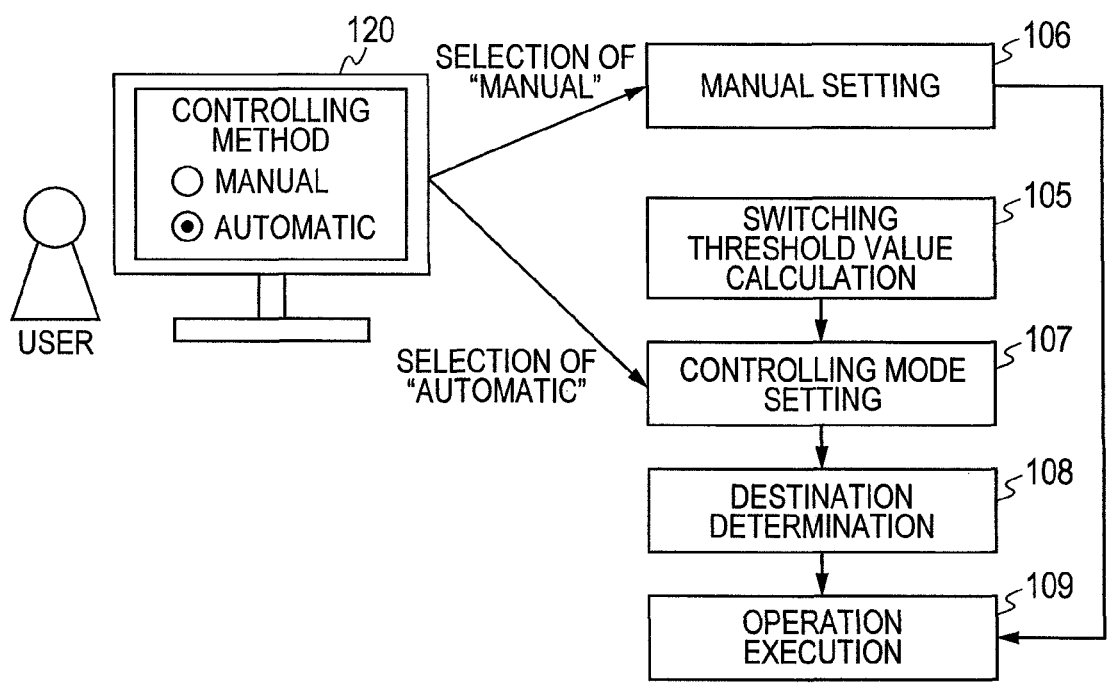
FIG. 3 is a diagram for explaining an outline of an operation controlling system of the semiconductor processing apparatus.

An outline of the operation controlling system of the semiconductor processing apparatus according to the present invention will be described using FIG. 3. As the controlling methods, a method of manual manipulation by a user and a method of an automatic operation are provided. The manual manipulation is transferred out mainly in maintenance of the apparatus or when an emergency event occurs. In the case of normal mass production, the automatic operation is performed. The selection of the controlling method is made by a user using the console terminal 120. In the case where the manual controlling method is selected with the console terminal 120, a manual processing routine is started.

In a manual setting process 106, if a user selects a wafer to be transferred and sets the destination thereof with the console terminal 120, an operation instruction is accordingly generated, and an operation is performed in an operation execution process 109 on the basis of the operation instruction. On the other hand, in the case where the automatic controlling method is selected, an automatic processing routine is started.

In a controlling mode setting process 107, it is determined whether the rates of the vacuum robots are to be controlled or the rates of the process chambers are to be controlled, and a controlling mode is determined. Next, in a destination determination process 108, the process chamber as the destination of each wafer is automatically calculated, and an operation is performed in an operation execution process 109 on the basis the destination. Further, when it is determined in the controlling mode setting process 107 whether the rates of the vacuum robots are to be controlled or the rates of the process chambers are to be controlled, a threshold value used for the determination is calculated in a switching threshold value calculation process 105.

Hereinafter, the automatic processing routine that is one of the characteristics of the present invention will be described in detail.

Figure 4:
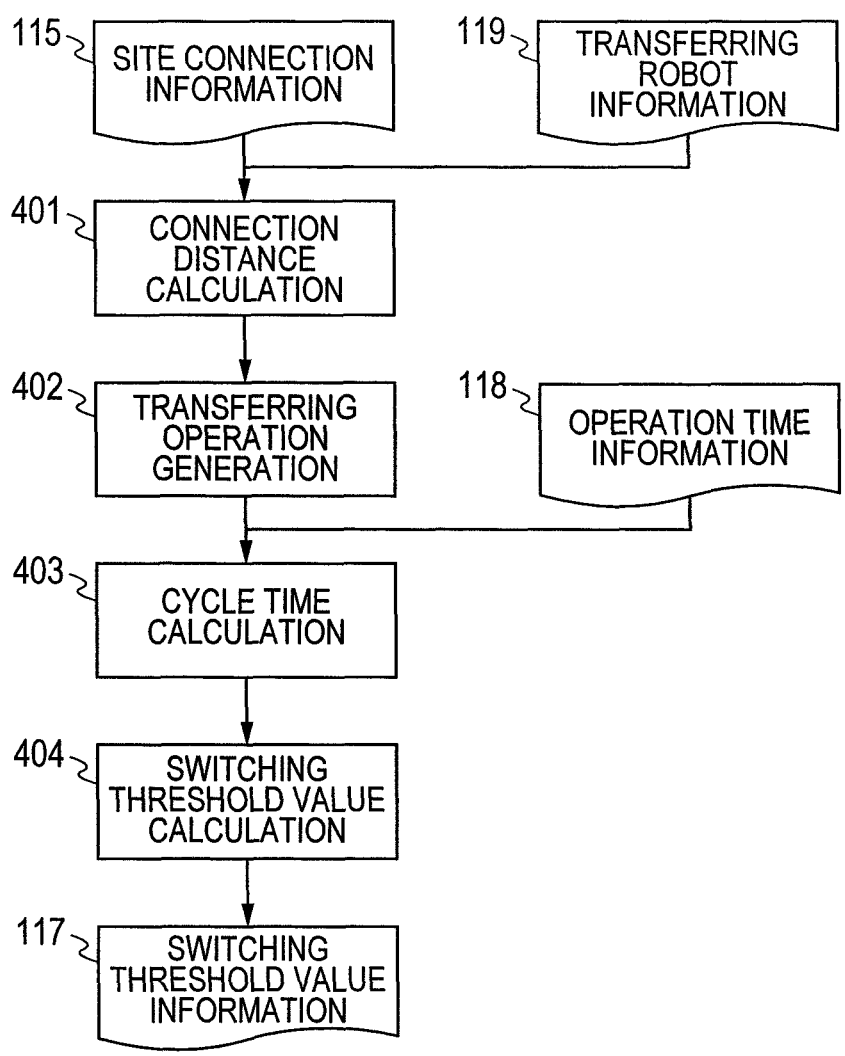
FIG. 4 is a diagram for explaining an outline of a switching threshold value calculation process.

The switching threshold value calculation process 105 will be described using FIG. 4. The switching threshold value is a boundary time between the processing time when the rates of the vacuum robots are controlled and the processing time when the rates of the process chambers are controlled. The time can be calculated in such a manner that when the busiest vacuum robot located nearest to the load lock is operated so as not to wait, a cycle time between the time the wafer is transferred to the process chamber by the vacuum robot and the time the wafer is transferred out of the process chamber by the vacuum robot is calculated, and the time required to carry the wafer to/out of the process chamber is subtracted from the cycle time.

The reason is as follows. The process is performed after the wafer is transferred in by the vacuum robot. However, if the process is completed by the time the vacuum robot comes to carry the wafer out of the process chamber, the process chamber needs to wait. Namely, the rate of the vacuum robot is controlled. On the contrary, if the process is not completed by the time the vacuum robot comes to carry the wafer out of the process chamber, the vacuum robot needs to wait. Namely, the rate of the process chamber is controlled. In addition, the reason of subtraction of the time required to carry the wafer to/out of the process chamber from the cycle time is that the process is not performed when the wafer is transferred to/out of the process chamber.

Further, the switching threshold value differs depending on the number of process chambers. As the number of process chambers becomes smaller, the cycle time between the time the vacuum robot carries the wafer to the process chamber and the time the vacuum robot comes to carry the wafer out of the process chamber for the next time becomes shorter. The reason is as follows. When the wafers are sequentially transferred to the plural process chambers, the number of transferring-in operations and transferring-out operations within a fixed interval by each vacuum robot becomes larger in each process chamber if the number of process chambers becomes smaller. Accordingly, it is necessary to calculate the switching threshold value in accordance with the number of process chambers.

In addition, the switching threshold value is calculated on the basis of the processing time of each vacuum robot, and can be accordingly calculated when the specification of the apparatus is found. Thus, the switching threshold value is calculated in advance before the cassettes in which the processing-target wafers are stored arrive at the apparatus to perform the process, and the calculated switching threshold value information is held.

Next, detailed calculation steps of the switching threshold value calculation process 105 will be described. This process includes four steps of connection distance calculation 401, transferring operation generation 402, cycle time calculation 403, and switching threshold value calculation 404.

Figure 28:
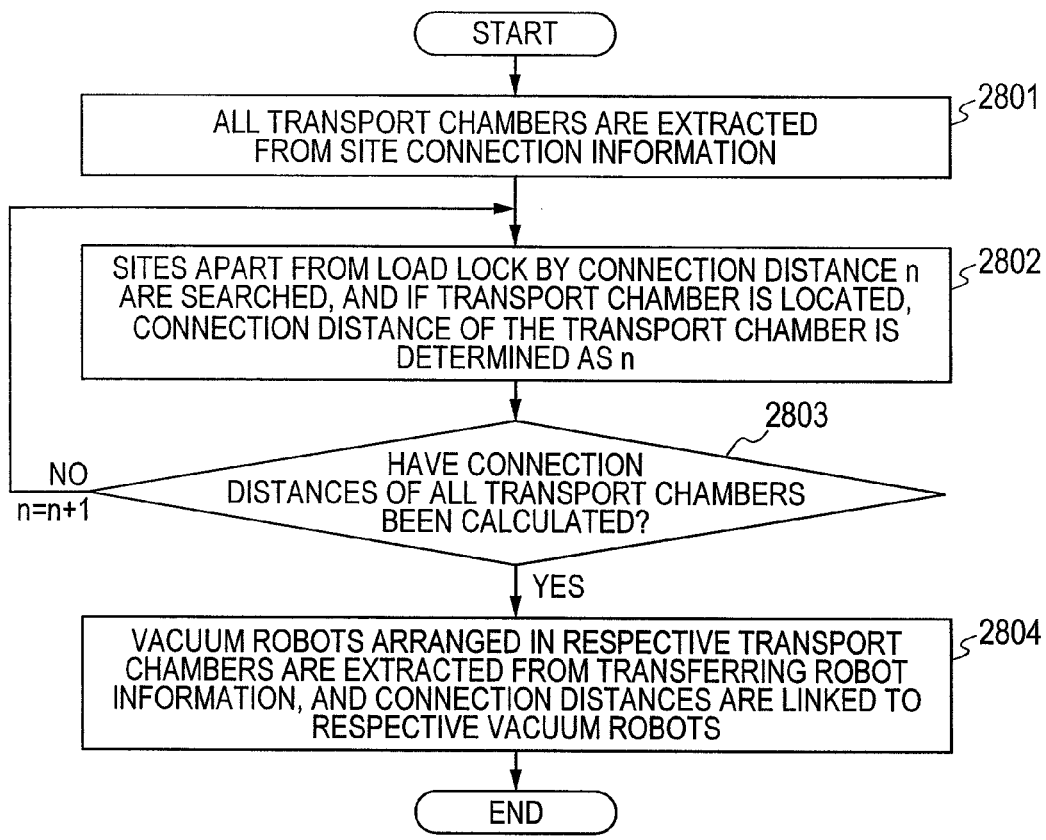
FIG. 28 is a diagram for showing a flowchart of a connection distance calculation process.

First, the connection distance calculation 401 will be described using a flowchart of FIG. 28.

The connection distance means a distance in a connection relation between each site and the load lock 211. First, in Step 2801, all transport chambers are extracted from a connection site 1 of site connection information 115. The site connection information 115 is information as exemplified in FIG. 23, and shows how the transport chambers, the process chambers, the load lock, and the buffer rooms are connected to each other. In the example exemplified in FIG. 23, the transport chamber 214, the transport chamber 215, and the transport chamber 216 are extracted.

Next, in Step 2802, the site connection information 115 is searched for the site distant from the load lock 211 by a connection distance of n. If the site located is one of the transport chambers that are extracted in Step 2801, the connection distance of the transport chamber is determined as n. The site with a connection distance of n can be located by searching the connection site 1 of the site connection information 115 for the site with a connection distance of n−1 and then obtaining the site corresponding to the data in a connection site 2. The search is started with n=1 at first. In the case of n=1, the connection site 1 of the site connection information 115 is searched for the load lock 211, and the site corresponding to the load lock 211 in the connection site 2 is extracted. Accordingly, the site of the connection site 2 is obtained. In the example shown in FIG. 23, the transport chamber 214 has a connection distance of 1.

In Step 2803, it is checked whether or not the connection distances of all transport chambers extracted in Step 2801 have been calculated. If the connection distances of all transport chambers have been calculated, the flow proceeds to Step 2804. If there are transport chambers whose connection distances have not been calculated, Step 2802 is repeated with a connection distance of n+1.

In the example shown in FIG. 23, the site with a connection distance of 2 is searched for the next time. The connection site 1 of the site connection information 115 is searched for the transport chamber 214 with a connection distance of 1, the corresponding sites in the connection site 2 are extracted. If the sites in the connection site 2 correspond to one of the extracted transport chambers, the transport chamber has a connection distance of 2. In this example, the sites with a connection distance of 2 are the buffer room 212, the process chamber 205, and the process chamber 206, and no transport chamber is present. Next, the sites with a connection distance of 3 are searched. The connection site 1 of the site connection information 115 is searched for the buffer room 212, the process chamber 205, and the process chamber 206 each having a connection distance of 2, and the corresponding sites in the connection site 2 are extracted. The process chamber 205 and the process chamber 206 are not present in the connection site 1. Thus, only the buffer room 212 is extracted, and the corresponding site in the connection site 2 is the transport chamber 215. Accordingly, the connection distance of the transport chamber 215 is calculated as 3. As similar to the above, the search is repeated while incrementing the connection distance one by one until the connection distances of all transport chambers are obtained. In this example, the calculation of the connection distances is completed when the connection distance of the transport chamber 216 is calculated as 5.

Next, in Step 2804, the vacuum robots arranged in the respective transport chambers are extracted from transferring robot information 119, and the connection distances of the respective transport chambers are considered as the connection distances of the corresponding vacuum robots. The transferring robot information 119 is information representing the sites in which the transferring robots are arranged and the types of robots. As an example for explanation, the vacuum robot arranged in the transport chamber 214 is the vacuum robot 217, and the connection distance of the transport chamber 214 is 1. Thus, the connection distance of the vacuum robot 217 is 1.

Figure 29:
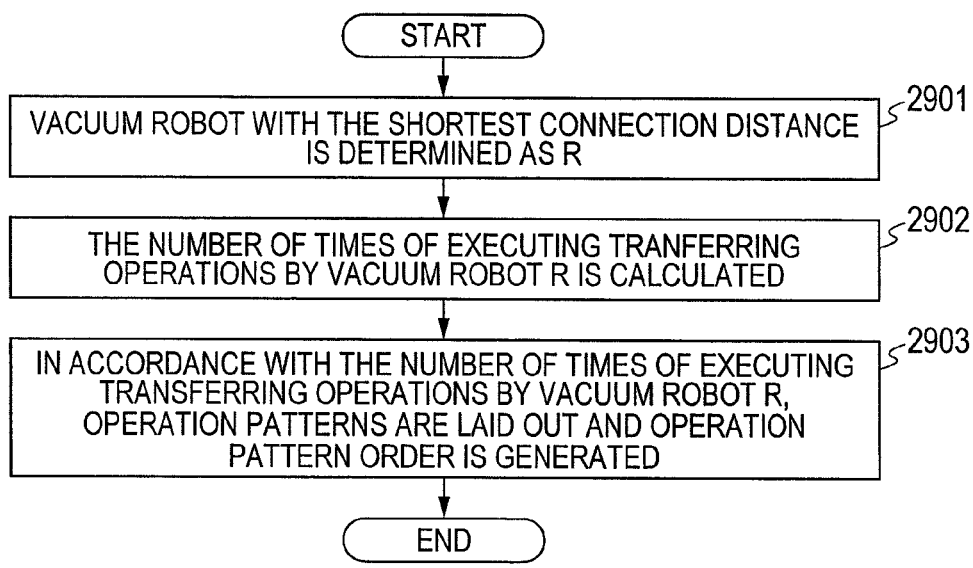
FIG. 29 is a diagram for showing a flowchart of a transferring operation generation process.

Next, the transferring operation generation 402 will be described using a flowchart of FIG. 29. In the transferring operation generation 402, the transferring operation order of the vacuum robot nearest to the load lock is generated. First, in Step 2901, the vacuum robot with the shortest connection distance is extracted, and is determined as a vacuum robot R. In this example, the vacuum robot 217 is the vacuum robot R.

Next, in Step 2902, the number of times of executing transferring operations by the vacuum robot R is calculated. The transferring operations have two kinds, one of which is a transferring operation to the process chamber, and the other of which is a transferring operation to the buffer room. In order to calculate each number of times of transferring operations, the number of process chambers connected to the transport chamber 214 in which the vacuum robot 217 as the vacuum robot R is arranged and the number of process chambers which are not connected to the transport chamber 214 are obtained. The number of process chambers which are connected to the transport chamber 214 is determined as the number of times of executing the transferring operations to the process chambers, and the number of process chambers which are not connected to the transport chamber 214 is determined as the number of times of executing the transferring operations to the buffer rooms.

First, the connection site 1 of the site connection information 115 is searched for the transport chamber 214, and the number of process chambers corresponding to the data included in the connection site 2 is counted. In the example shown in FIG. 23, the corresponding sites are the process chamber 205 and the process chamber 206, and thus the number of process chambers which are connected to the transport chamber 214 is 2. In addition, the total number of process chambers included in the connection site 2 of the site connection information 115 is counted and is determined as the total number of process chambers. In this example, the total number of process chambers is 6. If the number of process chambers which are connected to the transport chamber 214 is subtracted from 6, the number of process chambers which are not connected to the transport chamber 214 is obtained. In this example, 6−2=4 is satisfied. the number of process chambers which are connected to the transport chamber 214 corresponds to the number of times of transferring operations to the process chambers by the vacuum robot 217, and the number of process chambers which are not connected to the transport chamber 214 corresponds to the number of times of transferring operations to the buffer rooms by the vacuum robot 217. In the number of times of executing the transferring operations, the number of times of executing the transferring operations to the process chambers is 2, and the number of times of executing the transferring operations to the buffer rooms is 4.

Finally, in Step 2903, respective operation patterns are laid out in accordance with each number of times of executing the transferring operations by the vacuum robot R calculated in Step 2902, and the operation pattern order is generated. The operation pattern is the order of each operation by the vacuum robot R in the transferring operations to the process chambers and the transferring operations to the buffer rooms. The operation pattern of the transferring operations to the process chambers is formed as in the operation order of "load lock→process chamber", "wafer replacement in process chamber", "process chamber→load lock", and "wafer replacement in load lock". In addition, the operation pattern of the transferring operations to the buffer rooms is formed as in the operation order of "load lock→buffer room", "wafer replacement in buffer room", "buffer room→load lock", and "wafer replacement in load lock". In the example shown in Step 2805, the number of times of transferring operations to the process chambers is 2, and the number of times of transferring operations to the buffer rooms is 4. Accordingly, two operation patterns of the transferring operations to the process chambers and four operation patterns of the transferring operations to the buffer rooms are laid out. As a result, the operation pattern order shown in FIG. 5 is generated.

Figure 30:
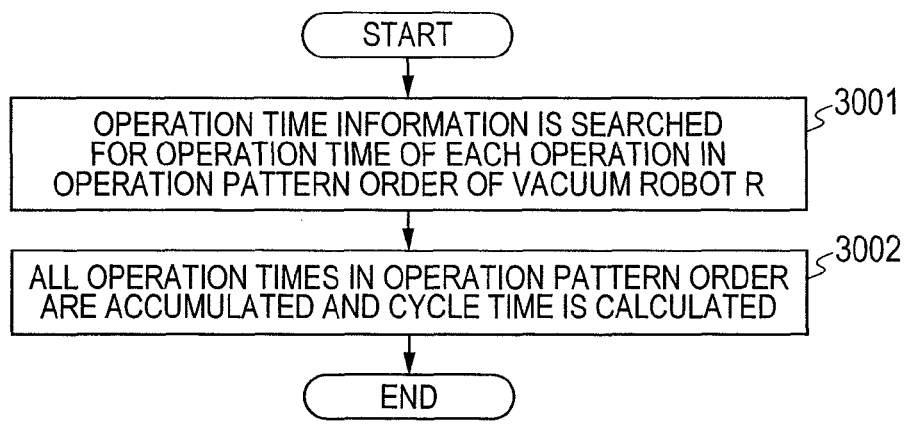
FIG. 30 is a diagram for showing a flowchart of a cycle time calculation process.

Next, the cycle time calculation 403 will be described using a flowchart shown in FIG. 30. First, in Step 3001, the operation time information 118 is searched to obtain the corresponding operation time of each operation among those in the operation pattern order generated in the transferring operation generation 402. The operation time information 118 is information representing the operation time in the transferring operation by each vacuum robot as exemplified in FIG. 26. Next, in Step 3002, the operation times of all operations are accumulated. The accumulated time corresponds to the cycle time.

Finally, the switching threshold value calculation 404 will be described. The switching threshold value is obtained by subtracting the operation time of "wafer replacement in process chamber" from the cycle time calculated in the cycle time calculation 403. In this example, the cycle time is 130, and the operation time of "wafer replacement in process chamber" is 10. Thus, the switching threshold value is 120. Accordingly, the switching threshold value information 117 as exemplified in FIG. 25 is generated. The total number of process chambers of the apparatus obtained in the transferring operation generation 402 is input to the number of process chambers of the switching threshold value information 117.

Figure 6:
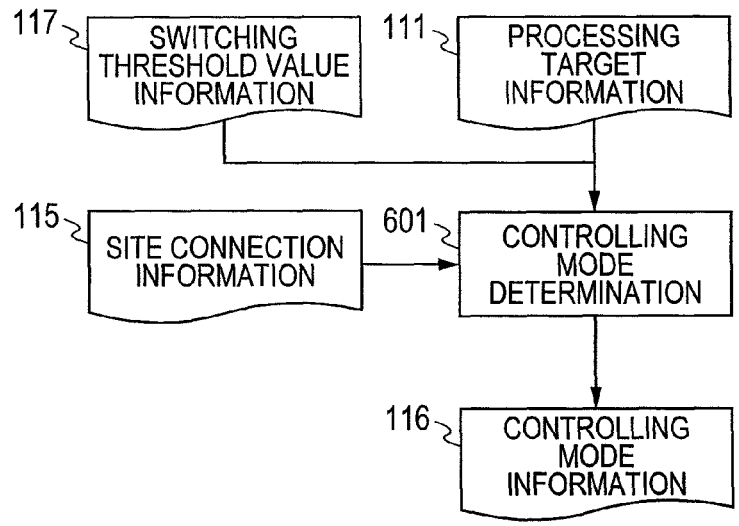
FIG. 6 is a diagram for explaining an outline of a controlling mode setting process.

Next, the controlling mode setting process 107 will be described using FIG. 6. The controlling mode setting process 107 is executed when a new cassette arrives at the FOUP 201 or 202. The process is computed by controlling mode determination 601 by inputting the processing-target information 111, the site connection information 115, and the switching threshold value information 117, and the controlling mode information 116 is output. The processing-target information 111 is information related to each wafer stored in the cassette placed on the FOUP 201 or 202. When the cassette is placed on the FOUP, the stored wafers are scanned, and scanned information is transmitted to the host computer 121. Then, the processing conditions of each wafer, for example, recipes such as a processing time, temperature, and gas concentration are downloaded from the host computer 121. The processing-target information 111 exemplified in FIG. 22 holds information of wafer numbers and processing times for the wafers. Finally, the controlling mode information 116 output in this process corresponds to information as exemplified in FIG. 24. If it is determined that the rates of the vacuum robots are to be controlled, a flag of a "selection" field for "robot high-performance mode" is turned on. If it is determined that the rates of the process chambers are controlled, a flag of a "selection" field for "process chamber high-performance mode" is turned on.

Figure 31:
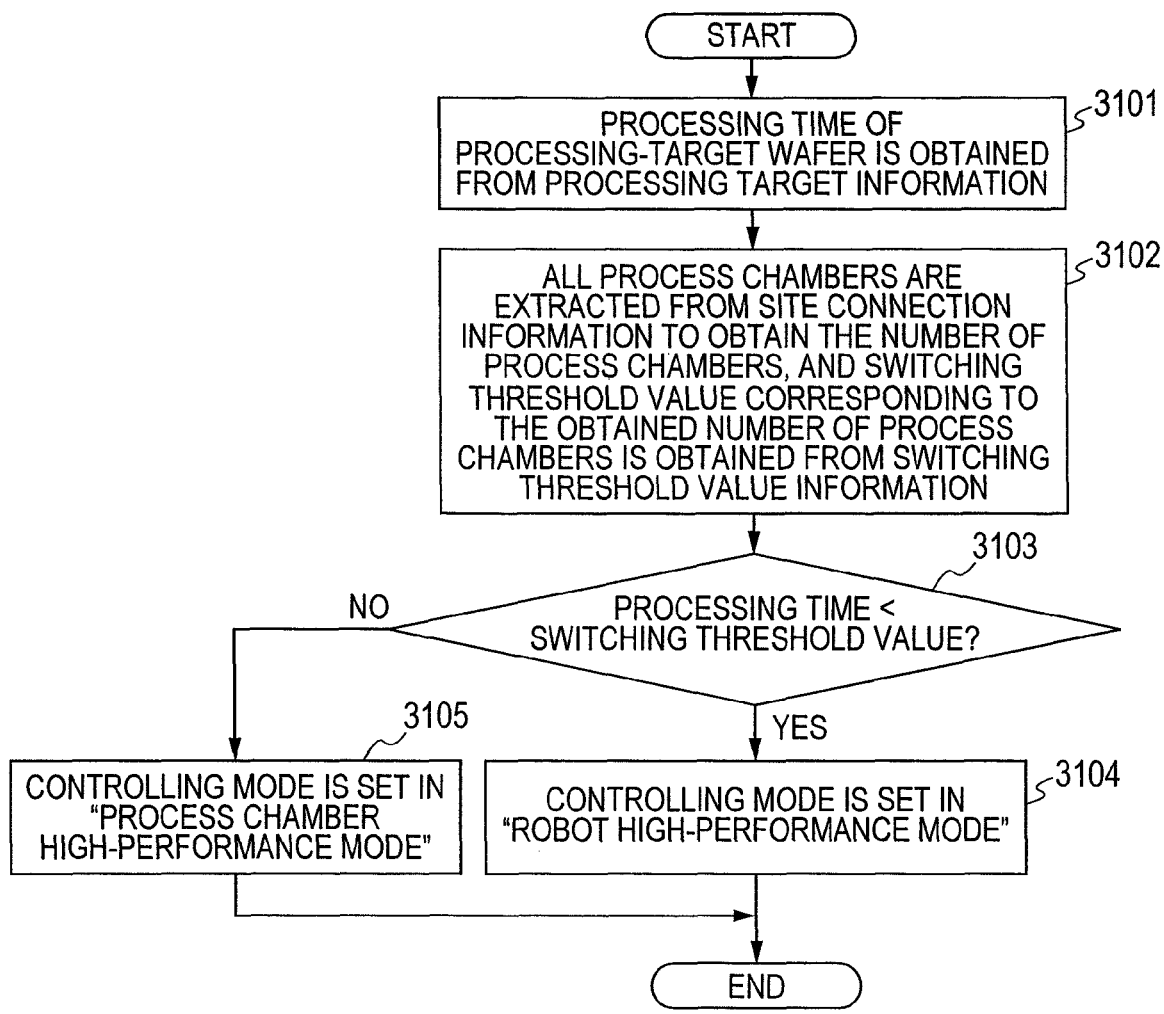
FIG. 31 is a diagram for showing a flowchart of a controlling mode determination process.

Next, calculation of the controlling mode determination 601 will be described using a flowchart shown in FIG. 31. First, in Step 3101, the processing time of the processing-target wafer is obtained from the processing-target information 111. Next, in Step 3102, all process chambers included in the connection site 2 of the site connection information 115 are extracted to obtain the number of process chambers. The switching threshold value information 117 is searched for data corresponding to the value of the obtained number of process chambers, and the switching threshold value of the data is obtained. Next, in Step 3103, the processing time obtained in Step 3101 is compared with the switching threshold value obtained in Step 3102. If the switching threshold value is smaller than the processing time, the rates of the vacuum robots are controlled, and the flow proceeds to Step 3104 to select "robot high-performance mode" as the controlling mode. On the other hand, if the switching threshold value is equal to or larger than the processing time, the rates of the process chambers are controlled, and the flow proceeds to Step 3105 to select "process chamber high-performance mode" as the controlling mode. Then, the controlling mode information 116 is generated.

Next, transferring methods by which the wafer is actually transferred in accordance with the controlling mode will be described. It is necessary to consider controlling methods as an apparatus when considering the transferring methods. The controlling methods are roughly divided into two kinds.

One of two controlling methods is a scheduling method. In the scheduling method, transferring operations are determined in advance, and actual transferring operations are performed on the basis of the determined transferring operations. For example, the process chamber as the destination is preliminarily determined for each transferring-target wafer, and the transferring operations are performed on the basis of the determined process chambers.

The other of two controlling methods is an event driven method. The process chamber as the destination is not preliminarily determined and fixed, but the transferring operations are performed every time the process chamber as the destination is determined in accordance with the status of the apparatus. The event driven method is characterized in a controlling rule for determining the process chamber in accordance with the status.

In the first embodiment, an example of an apparatus controlled by the scheduling method will be described.

Figure 7:
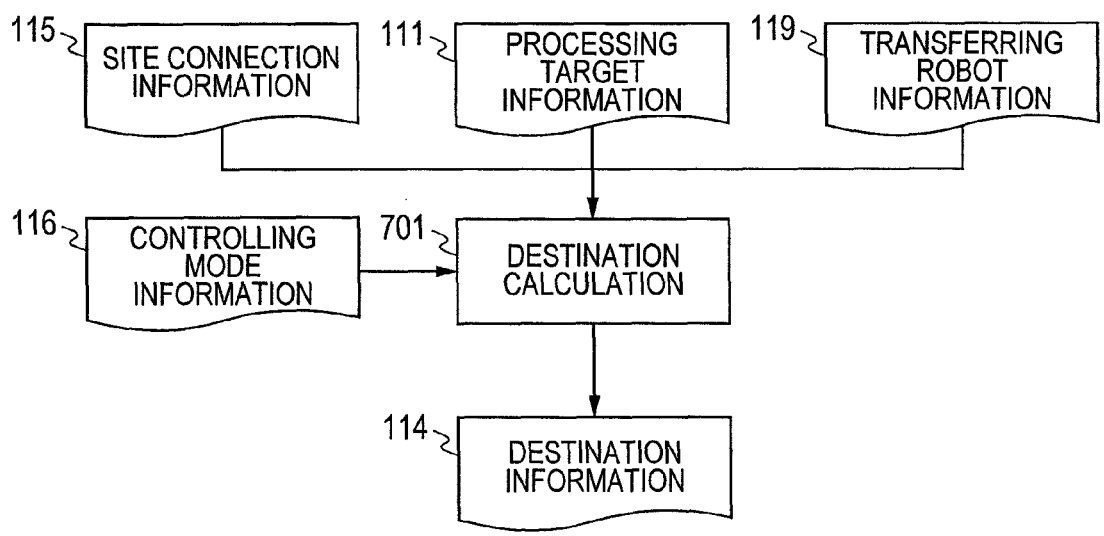
FIG. 7 is a diagram for explaining an outline of a destination determination process in a first embodiment.

First, the destination determination process 108 will be described using FIG. 7. A computing process is performed in the destination calculation 701 by inputting the processing-target information 111, the site connection information 115, the controlling mode information 116, and the transferring robot information 119, and the destination information 114 is output. The destination information 114 is information as exemplified in FIG. 20, and represents the process chambers as destinations for the respective wafers.

Two calculation procedures are prepared in the destination calculation 701 in accordance with the controlling modes. One of two calculation procedures is adapted for "robot high-performance mode" and the other of two calculation procedures is adapted for "process chamber high-performance mode". With reference to the controlling mode information 116, the calculation procedure corresponding to the controlling mode whose flag is turned on is selected, and calculation is performed.

Figure 8:
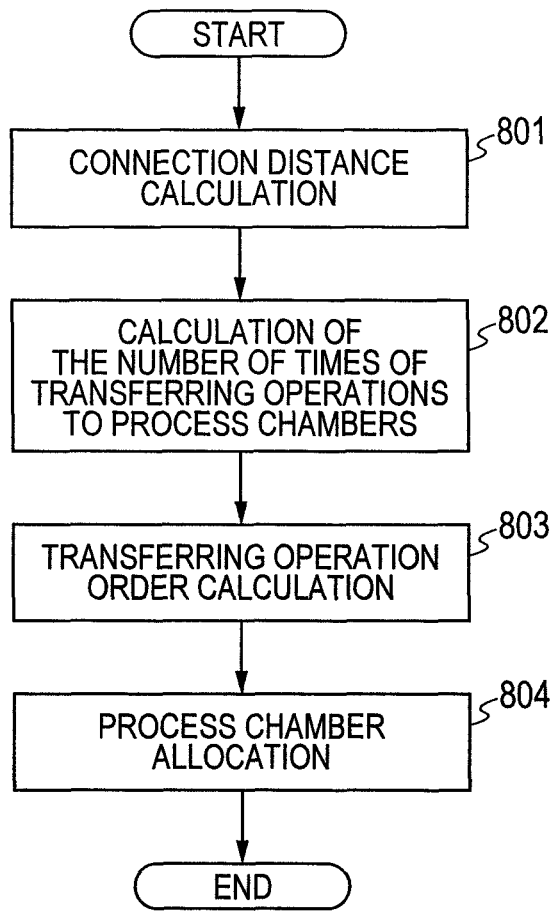
FIG. 8 is a diagram for explaining a calculation procedure of destination calculation in a robot high-performance mode in the first embodiment.

First, the calculation procedure in "robot high-performance mode" in the destination calculation 701 will be described using FIG. 8. This calculation includes four steps of connection distance calculation 801, calculation of the number of times of transferring operations to process chambers 802, transferring operation order calculation 803, and process chamber allocation 804.

First, the connection distance calculation 801 will described. The connection distance calculation 801 is performed in the same manner as the connection distance calculation 401 in the switching threshold value calculation process 105.

Figure 32:
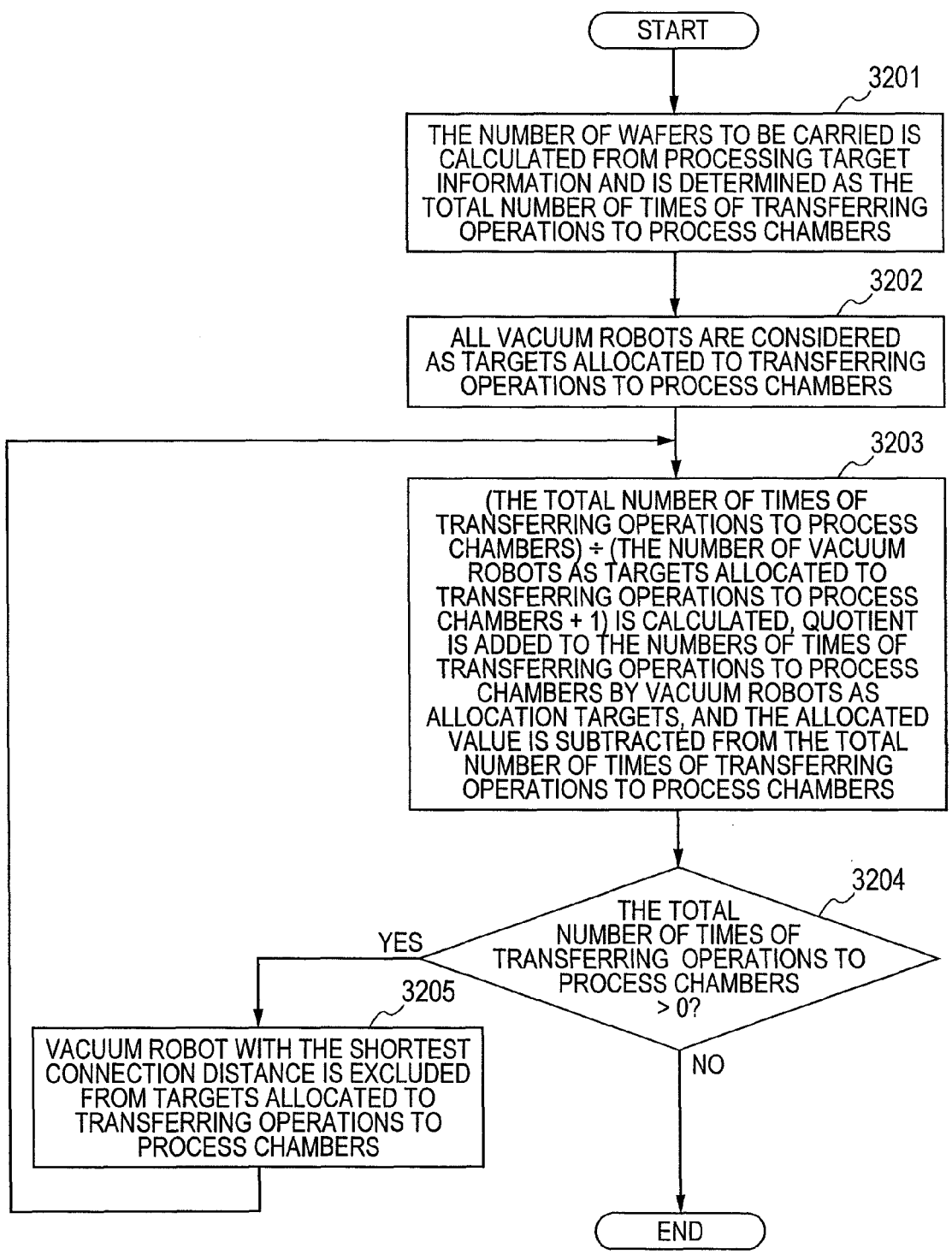
FIG. 32 is a diagram for showing a flowchart of a calculation process of the number of times of transferring operations to process chambers.

Next, the calculation of the number of times of transferring operations to process chambers 802 will be described using a flowchart of FIG. 32. First, in Step 3201, the number of processing-target wafers is counted on the basis of the processing-target information 111, and the total number is determined as the total number of times of transferring operations to process chambers. Next, in Step 3202, all vacuum robots are considered as targets allocated to the transferring operations to the process chambers, as an initial status. Next, in Step 3203, the quotient obtained by dividing the total number of times of transferring operations to the process chambers by the number of vacuum robots as the allocation targets+1 is added to the number of times of transferring operations to the process chambers by each vacuum robot as the allocation target, and the allocated value is subtracted from the total number of times of transferring operations to the process chambers. Then, in Step 3204, it is determined whether or not the total number of times of transferring operations to the process chambers is 0 or larger. If it is larger than 0, the flow proceeds to Step 3205. If it is 0 or smaller, the flow is terminated. In Step 3205, the vacuum robot with the shortest connection distance is excluded from the vacuum robots as the targets allocated to the transferring operations to the process chambers, and the flow returns to Step 3203.

An example of the process of the calculation of the number of times of transferring operations to process chambers 802 will be described. First, the number of processing-target wafers is counted on the basis of the processing-target information 111, and the total number of times of transferring operations to the process chambers is calculated as 25. Next, all vacuum robots, namely, the vacuum robots 217, 218, and 219 are considered as the vacuum robots as the targets allocated to the transferring operations to the process chambers. Here, if it is assumed that the numbers of times of transferring operations to the process chambers by the vacuum robots 217, 218, and 219 are represented as P1, P2, and P3 for explanation. In an initial status, P1=P2=P3=0 is satisfied.

Next, 6 that is the quotient obtained by dividing 25 that is the total number of times of transferring operations to the process chambers by 4 that is the value obtained by adding 1 to 3 that is the number of vacuum robots as the allocation targets is added to P1, P2, and P3. At this time, P1=P2=P3=6 is satisfied. Then, 18 that is the allocated value is subtracted from 25 that is the total number of times of transferring operations to the process chambers, and the total number of times of transferring operations to the process chambers is calculated as 7. Here, since the total number of times of transferring operations to the process chambers is larger than 0, the vacuum robot with the shortest connection distance is excluded from the vacuum robots as the allocations targets. In the case where the connection distance of the vacuum robot 217 is 1, the connection distance of the vacuum robot 218 is 3, and the connection distance of the vacuum robot 219 is 5 in the connection distance calculation 801, the vacuum robot 217 is excluded from the vacuum robots as the allocation targets.

Next, 7 that is the total number of times of transferring operations to the process chambers is allocated to P2 and P3. 7 that is the total number of times of transferring operations to the process chambers is divided by 3 that is the value obtained by adding 1 to 2 that is the number of vacuum robots as the allocation targets, and 2 that is the quotient is added to P2 and P3. At this time, P1=6 and P2=P3=8 are satisfied. Then, the total number of times of transferring operations to the process chambers is calculated as 3. Here, since the total number of times of transferring operations to the process chambers is larger than 0, the vacuum robot 218 that is one with the shortest connection distance is excluded from the vacuum robots as the allocation targets. Then, 3 that is the total number of times of transferring operations to the process chambers is added to P3, so that P1=6, P2=8, and P3=11 are satisfied. As described above, the calculation is performed in such a manner that the number of times of transferring operations to the process chambers is increased for the vacuum robot with a longer connection distance from the load lock. It should be noted that the calculation algorithm for the number of times of transferring operations to the process chambers is an example, but other calculation algorithms may be used as long as the number of times of transferring operations to the process chambers is increased for the vacuum robot with a longer connection distance from the load lock.

Figure 33:
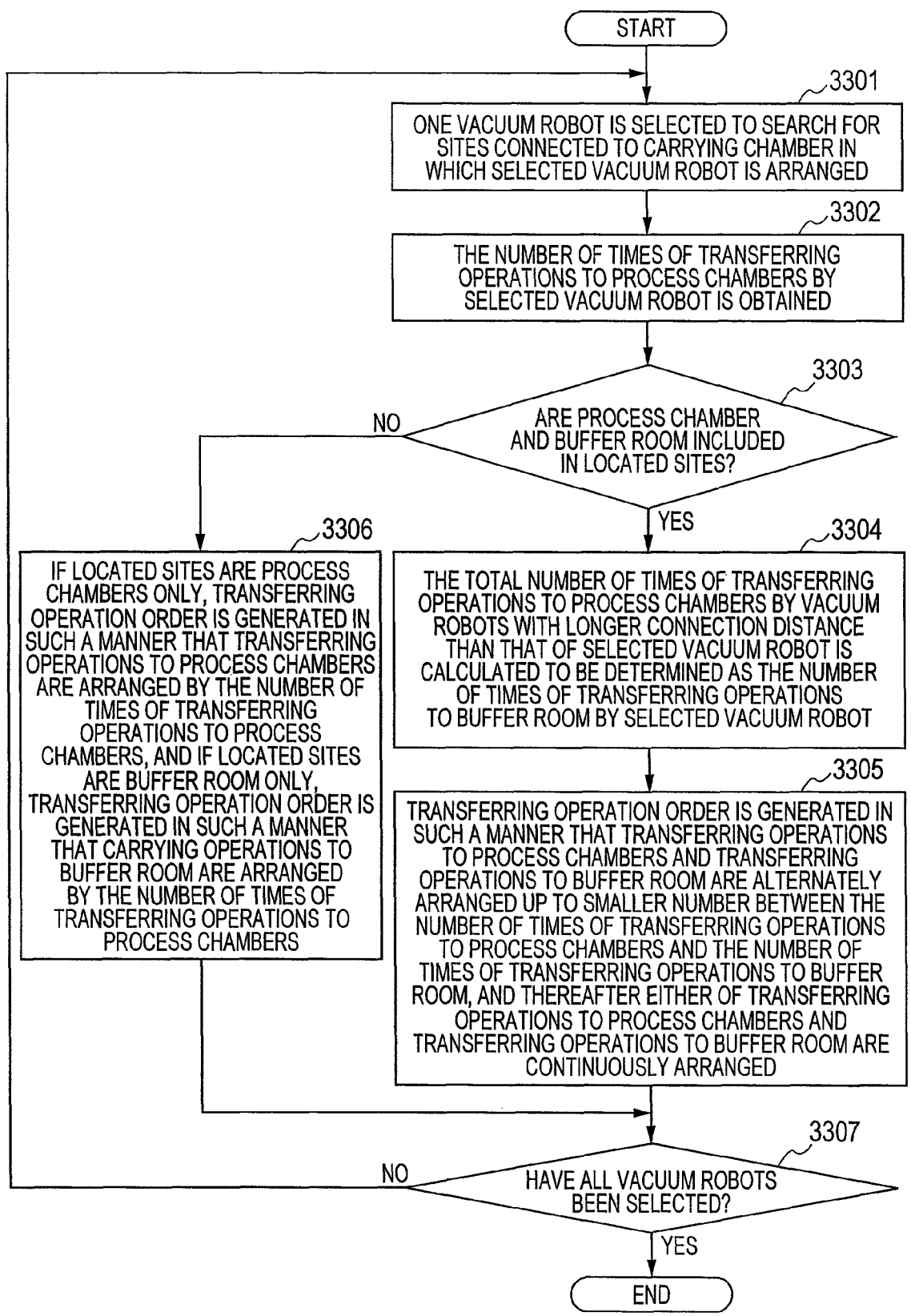
FIG. 33 is a diagram for showing a flowchart of a transferring operation order calculation process.

Next, the transferring operation order calculation 803 will be described using a flowchart of FIG. 33.

First, in Step 3301, one of all vacuum robots is selected and the transport chamber in which the selected vacuum robot is arranged is extracted from the transferring robot information 119. The connection site 1 of the site connection information 115 is searched for the extracted transport chamber, and all sites corresponding to the located data in the connection site 2 are extracted. Next, in Step 3302, the number of times of transferring operations to the process chambers by the selected vacuum robot is obtained. Then, in Step 3303, it is checked whether or not both of the process chamber and the buffer room are included in the sites extracted in Step 3301. If the both are included, the flow proceeds to Step 3304. If one or both of the process chamber and the buffer room is (are) not included, the flow proceeds to Step 3306.

Next, in Step 3304, the total number of times of transferring operations to the process chambers by the vacuum robots whose connection distances are longer than that of the selected vacuum robot is obtained, and is determined as the number of times of transferring operations to the buffer rooms by the selected vacuum robot.

Next, in Step 3305, a transferring operation order 1 is generated in such a manner that the transferring operations to the process chambers and the transferring operations to the buffer rooms are alternately arranged up to the smaller number between the number of times of transferring operations to the process chambers and the number of times of transferring operations to the buffer rooms by the selected vacuum robot. Further, a difference between the number of times of transferring operations to the process chambers and the number of times of transferring operations to the buffer rooms is obtained, and the transferring operations with the larger number are continuously arranged by the difference, and the arranged transferring operations are added to the end of the transferring operation order 1 to generate the transferring operation order of the selected vacuum robot.

In addition, in Step 3306, if only the process chambers are included in the sites extracted from the site connection information 115 in Step 3301, all operations are arranged as the transferring operations to the process chambers in the transferring operation order of the selected vacuum robot. If only the buffer rooms are included in the sites extracted from the site connection information 115, all operations are arranged as the transferring operations to the buffer rooms in the transferring operation order of the selected vacuum robot.

Then, in Step 3307, it is checked whether or not the transferring operation orders of all vacuum robots have been generated. If so, the flow is terminated. If not, the flow returns to Step 3301.

It should be noted that the calculation algorithm of the transferring operation order is an example, and other calculation algorithms may be used as long as the number of continuous transferring operations to the process chambers is reduced as small as possible and the number of continuous transferring operations to the buffer rooms is calculated to be an odd number with the highest possible probability.

Here, an example of the process of the transferring operation order calculation 803 will be described. One vacuum robot is selected from the transferring robot information 119, and the transport chamber in which the selected vacuum robot is arranged is extracted. Here, the embodiment will be described on the assumption that the vacuum robot 217 is selected. First, in Step 3301, it can be found that the transport chamber in which the vacuum robot 217 is arranged is the transport chamber 214 on the basis of the transferring robot information 119. Accordingly, the connection site 1 of the site connection information 115 is searched for data of the transport chamber 214, and the sites corresponding to the located data in the connection site 2 are extracted. Then, the buffer room 212, and the process chambers 205 and 206 are extracted. Further, in Step 3302, since the number of times of transferring operations to the process chambers by the vacuum robot 217 is calculated as 6 in the calculation of the number of times of transferring operations to the process chambers 802, 6 is obtained. Here, since the sites extracted in Step 3301 include both of the buffer room and the process chamber, the flow proceeds to Step 3304. The vacuum robots whose connection distances are longer than that of the vacuum robot 217 are determined as the vacuum robots 218 and 219 in the connection distance calculation 801. Accordingly, the sum of the numbers of times of transferring operations to the process chambers by the vacuum robots 218 and 219 is 19 that is equal to the number of times of transferring operations to the buffer rooms by the vacuum robot 217. Next, 6 that is the number of times of transferring operations to the process chambers by the vacuum robot is compared with 19 that is the number of times of transferring operations to the buffer rooms by the transferring robot, and the transferring operation order 1 in which 6 pieces of the transferring operations to the process chambers and the transferring operations to the buffer rooms are alternately arranged. Then, the transferring operation order in which the transferring operation to the buffer room is repeated by 13 that is obtained by subtracting 6 that is the number of times of transferring operations to the process chambers from 19 that is the number of times of transferring operations to the buffer rooms is added to the end of the transferring operation order 1 obtained in the process to generate the transferring operation order of the vacuum robot 217.

Further, there will be described a case in which the vacuum robot 219 is selected.

First, in Step 3301, since the transport chamber in which the vacuum robot 219 is arranged is the transport chamber 216, and the connection site 1 of the site connection information 115 is searched for data of the transport chamber 216 to extract the sites corresponding to the located data in the connection site 2. Then, the process chambers 209 and 210 are extracted. In Step 3302, the number of times of transferring operations to the process chambers by the vacuum robot 219 is calculated as 11 in the calculation of the number of times of transferring operations to the process chambers 802, and thus 11 is obtained. Here, since the sites extracted in Step 3301 is only the process chambers, the flow proceeds to Step 3306. Since the extracted sites are only the process chambers, the transferring operation order of the vacuum robot 219 is generated in such a manner that the transferring operation to the process chamber is repeated 11 times that is the number of times of transferring operations to the process chambers obtained in Step 3302.

Figure 34:
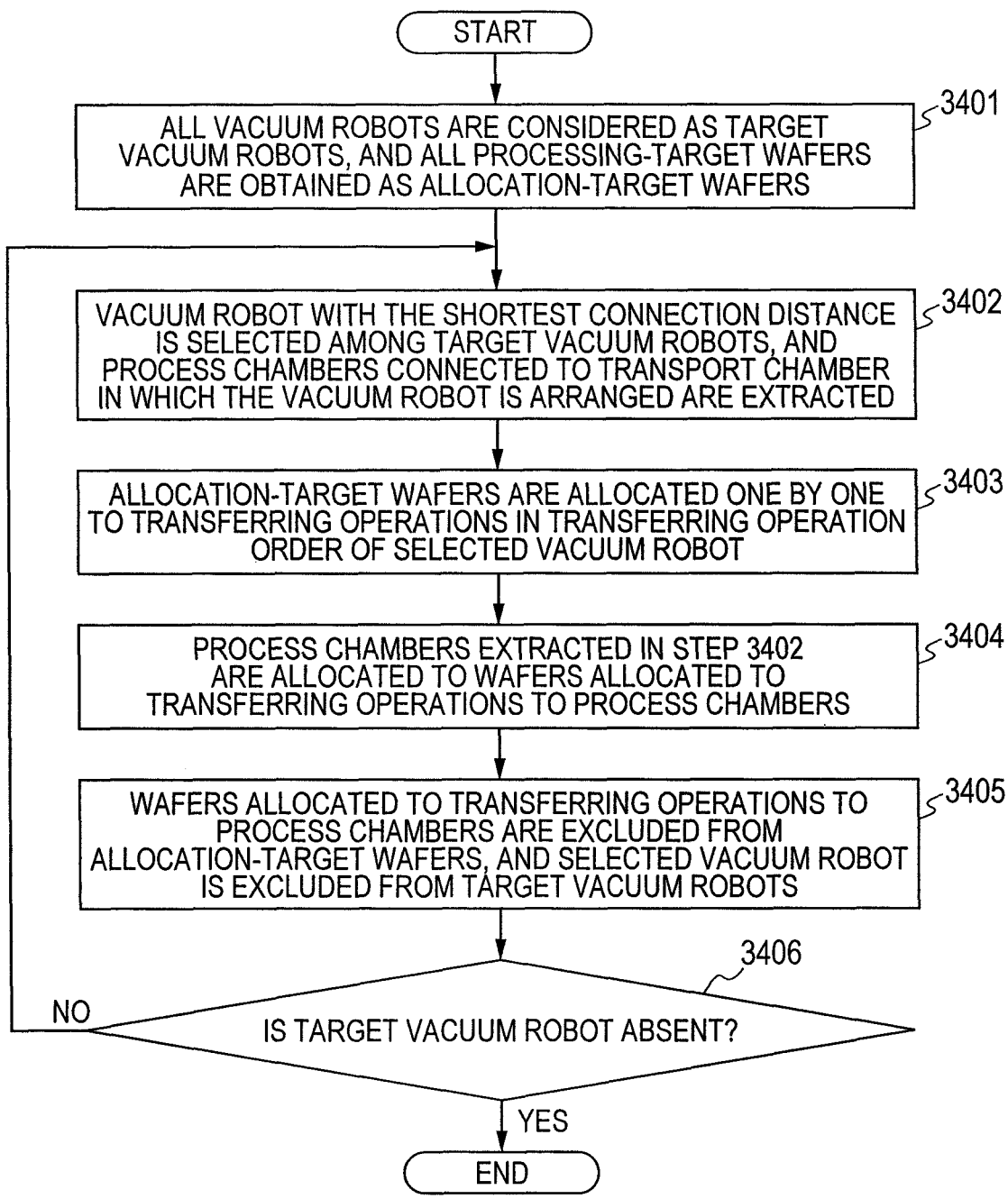
FIG. 34 is a diagram for showing a flowchart of a process chamber allocation process.

Next, the process chamber allocation 804 will be described using a flowchart of FIG. 34.

First, in Step 3401, all vacuum robots in the transferring robot information 119 are considered as target vacuum robots, as an initial status. In addition, all processing-target wafers are extracted from the processing-target information 111, and the extracted wafers are considered as allocation target wafers. Next, in Step 3402, the vacuum robot with the shortest connection distance among the target vacuum robots is selected, the transport chamber in which the selected vacuum robot is arranged is extracted from the transferring robot information 119, and the connection site 1 of the site connection information 115 is searched for data of the extracted transport chamber to extract the process chamber among the sites corresponding to the located data in the connection site 2. Next, in Step 3403, the allocation target wafers are allocated one by one to the transferring operations in the transferring order of the selected vacuum robot, namely, the transferring operations to the process chambers and the transferring operations to the buffer rooms. Next, in Step 3404, the process chamber extracted in Step 3402 is allocated to the wafer that is allocated to be transferred to the process chamber. At this time, if there are plural process chambers, the wafers are evenly allocated to the process chambers. Then, in Step 3405, the wafer allocated to be transferred to the process chamber is excluded from the allocation target wafers, and the selected vacuum robot is excluded from the target vacuum robots. Finally, in Step 3406, it is checked whether or not the target vacuum robot is present. If no target vacuum robot is present, the flow is terminated. If present, the flow returns to Step 3402.

Here, an example of the process of the process chamber allocation 804 will be described. As an initial status, it is assumed that all vacuum robots are the target vacuum robots and all processing-target wafers are the allocation target wafers. First, one target vacuum robot is selected. It can be found that the vacuum robot with the shortest connection distance is the vacuum robot 217 from the result of the connection distance calculation 801. Then, since the transport chamber in which the vacuum robot 217 is arranged is the transport chamber 214, the connection site 1 of the site connection information 115 is searched for data of the transport chamber 214, and the sites corresponding to the data in the connection site 2 are extracted. Then, the process chambers among the extracted sites are extracted. In this example, the process chamber 205 and the process chamber 206 are extracted.

Next, the allocation target wafers are allocated one by one to the respective transferring operations in the transferring operation order of the vacuum robot 217 calculated in the transferring operation order calculation 803. In the transferring operation order of the vacuum robot 217, "transferring operation to process chamber" and "transferring operation to buffer room" are repeated 6 times, and thereafter "transferring operation to buffer room" is repeated 13 times. The allocation target wafers W1 to W25 are allocated to the transferring operations from the beginning. Specifically, if W1 is allocated to "transferring operation to process chamber", W2 is allocated to "transferring operation to buffer room", and W3 is allocated to "transferring operation to process chamber", W1, W3, W5, W7, W9, and W11 are allocated to "transferring operation to process chamber", and the other allocation target wafers are allocated to "transferring operation to buffer room". Then, the process chambers are allocated to the wafers allocated to "transferring operation to process chamber". The process chambers extracted in the previous step are the process chambers 205 and 206. Thus, the allocation target wafers are evenly allocated to two process chambers. As a result, W1, W5, and W9 are allocated to the process chamber 205, and W3, W7, and w11 are allocated to the process chamber 206.

Then, the selected vacuum robot 217 is excluded from the target vacuum robots, and W1, W3, W5, W7, W9, and W11 are excluded from the allocation target wafers. Here, it is checked whether or not the target vacuum robot is present. Since the vacuum robots 218 and 219 are present as the target vacuum robots, the flow returns to Step 3402 to repeat the process.

Figure 9:
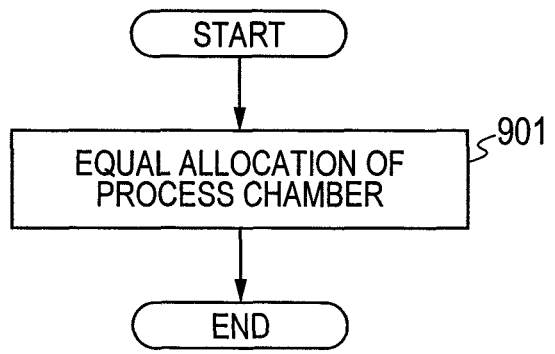
FIG. 9 is a diagram for explaining a calculation procedure of destination calculation in a process chamber high-performance mode in the first embodiment.

Next, a calculation procedure in "process chamber high-performance mode" in the destination calculation 701 will be described using FIG. 9.

This calculation includes equal allocation of process chamber 901. In this calculation, the wafers are allocated to the process chambers as equal in number as possible. First, the allocation target wafers are obtained from the processing-target information 111. Next, all process chambers to which the wafers are allocated and which are included in the connection site 2 of the site connection information 115 are extracted and obtained. Then, the wafer numbers are arranged in ascending order, and the process chamber numbers are arranged in ascending order. The top of the arranged wafers is allocated to the top of the arranged process chambers. Next, the second wafer of the arranged wafers is allocated to the second process chamber of the arranged process chambers. The wafers are sequentially allocated in the following manner: the wafer number W1 is allocated to the process chamber 205, W2 is allocated to the process chamber 206, W3 is allocated to the process chamber 207, and so on. Then, when the wafer is allocated to the last process chamber, the next wafer is allocated to the top process chamber again. In this example, if W6 is allocated to the process chamber 210, the next wafer is allocated to the process chamber 205 again. Namely, W7 is allocated to the process chamber 205. With this procedure, W1, W7, W13, W19, and W25 are allocated to the process chamber 205, W2, W8, W14, and W20 are allocated to the process chamber 206, W3, W9, W15, and W21 are allocated to the process chamber 207, W4, W10, W16, and W22 are allocated to the process chamber 208, W5, W11, W17, and W23 are allocated to the process chamber 209, and W6, W12, W18, and W24 are allocated to the process chamber 210.

Figure 10:
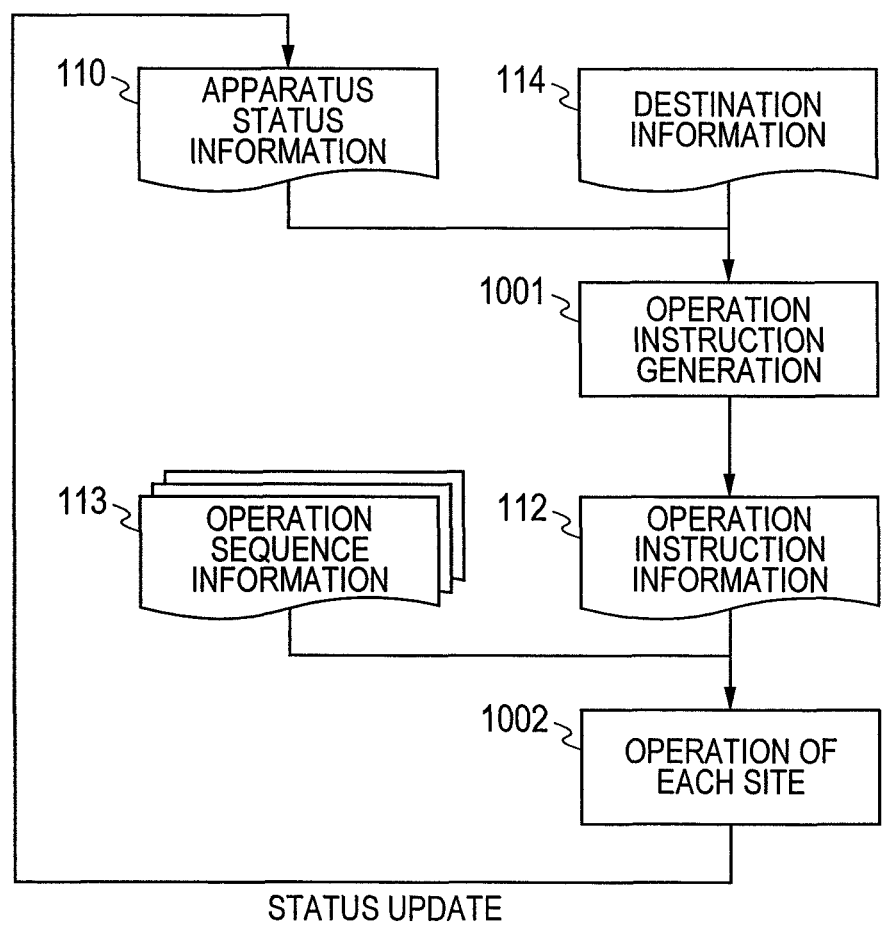
FIG. 10 is a diagram for explaining an outline of an operation execution process in the first embodiment.

Next, an outline of the operation execution process 109 will be described using FIG. 10.

In the operation execution process 109, the operations of the respective sites are actually performed on the basis of the information of the operation instruction. The operation execution process 109 is roughly divided into two processing steps. One step is operation instruction generation 1001. In the operation instruction generation 1001, the operation instruction information 112 is generated by inputting the apparatus status information 110 and the destination information 114. The apparatus status information 110 is information as exemplified in FIG. 18, and representing the statuses of the respective sites, the wafer numbers in the corresponding sites, and the statuses of processes. For example, data of "site: load lock 221_stage 1, status: vacuum, wafer number: W11, wafer status: unprocessed" represent the status of a first stage of a wafer holding mechanism of the load lock 221. The status of the load lock is in the vacuum status, the wafer with the wafer number W11 is held, and W11 is an unprocessed wafer. In operation instruction generation 1001, operation instruction information is generated on the basis of an operation instruction rule as exemplified in FIG. 11. When the conditions of the apparatus status and the destination are met with reference to the operation instruction rule, the operation instruction is generated. For example, the operation instruction of "transferring from load lock 211 to buffer room 212" is generated when the conditions of "unprocessed wafer to be transferred to other than process chambers 205 and 206 is present in load lock 211 and load lock 211 is in vacuum status", "available stage is present in buffer room 212" and "at least one hand of vacuum robot 217 is in standby status" are met. If it is assumed that the unprocessed wafer with the wafer number W10 is present on a stage 1 of the load lock 211, the destination of W10 is the process chamber 207, a stage 5 of the buffer room 212 is available, and a hand 1 of the vacuum robot 217 is in the standby status, the operation instruction of "hand 1 of vacuum robot 217 carries wafer with wafer number W10 from stage 1 of load lock 211 to stage 5 of buffer room 212" is generated. An example of the generated operation instruction information 112 is shown in FIG. 19. In addition, the operation instruction rule exemplified in FIG. 11 is an example, and is prepared for each of all operations.

Next, the process of operation of each site 1002 that is the second processing step of the operation execution process 109 will be described.

In the process of the operation of each site 1002, each site is operated by inputting the operation instruction information 112 generated in the operation instruction generation 1001 and the operation sequence information 113. In the operation sequence information 113, the order of operations performed by the respective sites is described in order to execute the generated operation instruction. The operations of the respective sites are, for example, elongating and contracting of arms of the vacuum robot, pivoting to turn the direction, or opening and closing of the gate valves. The operation sequence information 113 is exemplified in FIG. 21 for explanation. This example is operation sequence information for executing the operation instruction to carry the wafer from the load lock 211 to the buffer room 212. The operations are performed in the order of the numbers described as "operation order" in the operation sequence information. The same number means that the operations are performed at the same time. Then, the respective sites perform the described operations.

For example, when transferring the wafer from the load lock 211 to the buffer room 212, the vacuum-side gate valve 221 of the load lock 211 is opened. At the same time, the vacuum robot 217 pivots to face the direction of the load lock 211. Next, the vacuum robot 217 takes the wafer out of the load lock 211.

Next, the vacuum robot 217 pivots to face the direction of the buffer room 212. At the same time, the vacuum-side gate valve 221 of the load lock 211 is closed. At the same time, the gate valve 224 of the buffer room 212 on the side of the transport chamber 214 is opened. Next, the vacuum robot 217 places the wafer in the buffer room 212. Finally, the gate valve 224 of the buffer room 212 on the side of the transport chamber 214 is closed. Accordingly, the sites such as the robots and the gate valves are actually operated on the basis of the operation sequence information. Further, the operation sequence information is prepared for each of all operation instructions.

Every time the operations are actually performed in the above-described process, the status of the apparatus is changed. For example, when the hand 1 of the vacuum robot 217 is started to pivot, the hand 1 of the vacuum robot 217 is changed from the standby status to the being-operated status. When the vacuum robot takes the wafer out of the load lock 211, the wafer with the wafer number W10 is held. Then, when the wafer is placed in the buffer room 212, the hand 1 of the vacuum robot 217 is changed to the standby status, and does not hold the wafer. Further, the wafer with wafer number W10 is held on the stage 1 of the load lock 211. However, when the vacuum robot 217 takes out the wafer, no wafer is held on the stage 1 of the load lock 211. On the other hand, no wafer is held on the stage 5 of the buffer room 212. However, when the vacuum robot 217 places the wafer, the stage 5 of the buffer room 212 is changed to a status in which the wafer with the wafer number W10 is held. As described above, every time any operation is performed, the apparatus status information 110 is updated. Every time the apparatus status information 110 is updated, the apparatus status information and the destination information are checked against the operation instruction rule, and the operation instruction is generated if the conditions are met. The operation execution process 109 is repeated until no operation instruction is generated.

Figure 17:
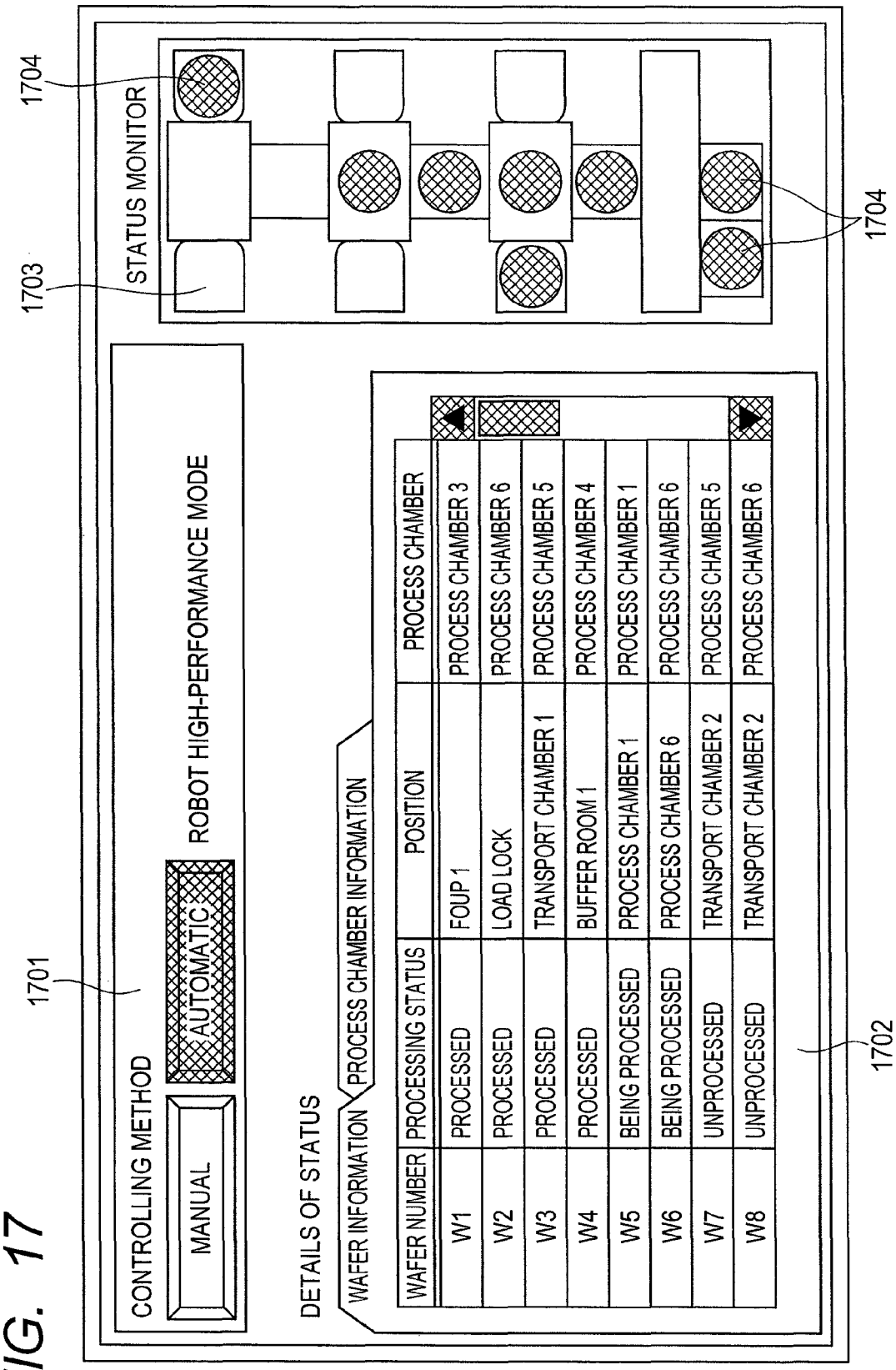
FIG. 17 is a diagram for showing an example of a screen of a console terminal.

Finally, a screen of the console terminal 120 will be described using FIG. 17.

The console terminal 120 has input units and an output unit, and a keyboard, a mouse, a touch pen and the like are provided as the input units. Further, a screen is provided as the output unit. On the screen, there are an area 1701 for selecting the controlling method, an area 1702 for displaying detailed data of the status of the apparatus, and an area 1703 for displaying an outline of the status of the apparatus. In the area 1701 for selecting the controlling method, there are buttons for selecting "automatic" or "manual" as the controlling method. If one of them is selected or input, the selection status can be recognized by changing the color of the selected one.

Further, in the case where "automatic" is selected, the controlling mode in which the apparatus is being operated is displayed. In the area 1702 for displaying detailed data of the status of the apparatus, detailed statuses of the wafers, the process chambers, and the transferring mechanisms in the apparatus are displayed. In the area 1703 for displaying an outline of the status of the apparatus, the positions of the apparatus and the wafers are visually displayed so that a user can easily recognize the position of each wafer. When the wafer is moved, the display position of the wafer is accordingly changed.

Second Embodiment

Next, a second embodiment will be described. In the second embodiment, an apparatus controlled by the event driven method as the controlling method will be described as an example.

An outline of the entire configuration of a semiconductor processing apparatus is the same as that in the first embodiment described using FIG. 1. Further, the configurations of process chambers and transferring mechanisms are the same as those in the first embodiment described using FIG. 2. In addition, an outline of an operation controlling system of the semiconductor processing apparatus is the same as that in the first embodiment described using FIG. 3. Further, a switching threshold value calculation process 105 is the same as that in the first embodiment described using FIG. 4. Further, a controlling mode setting process 107 is the same as that in the first embodiment described using FIG. 6.

Figure 12:
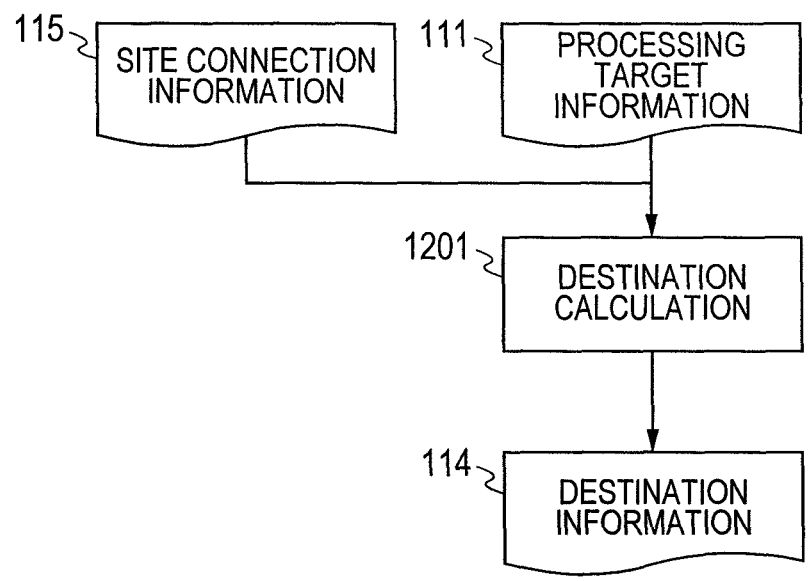
FIG. 12 is a diagram for explaining an outline of a destination determination process in a second embodiment.
Figure 13:
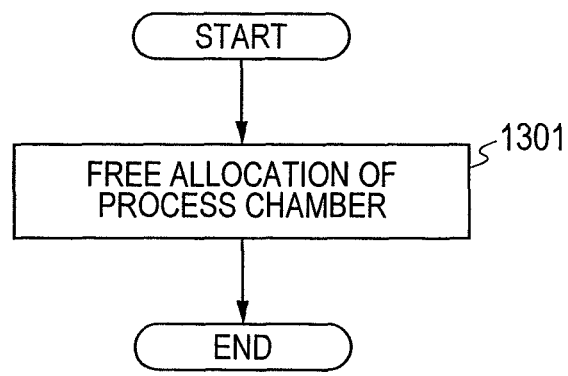
FIG. 13 is a diagram for explaining a calculation procedure of destination calculation in the second embodiment.

Next, a destination determination process 108 in the second embodiment will be described using FIG. 12. In this process, a computing process is performed in destination calculation 1201 by inputting the processing-target information 111 and the site connection information 115, and the destination information 114 is output. A detailed calculation procedure of the destination calculation 1201 will be described using FIG. 13. This calculation includes a step of free allocation of process chamber 1301. In the free allocation of process chamber 1301, all process chambers which can process the wafers are allocated to the processing-target wafers. This means that any one of the allocated process chambers may be used. First, all process chambers are extracted from the connection site 2 of the site connection information 115. Then, all wafers are extracted from the processing-target information 111, and all process chambers extracted from the site connection information 115 are allocated to all wafers. Accordingly, the destination information 114 contains data such as "wafer number: W1, destination: process chambers 205, 206, 207, 208, 209, and 210". This means that the wafer number W1 may be transferred to any one of the process chambers 205, 206, 207, 208, 209, and 210.

Figure 14:
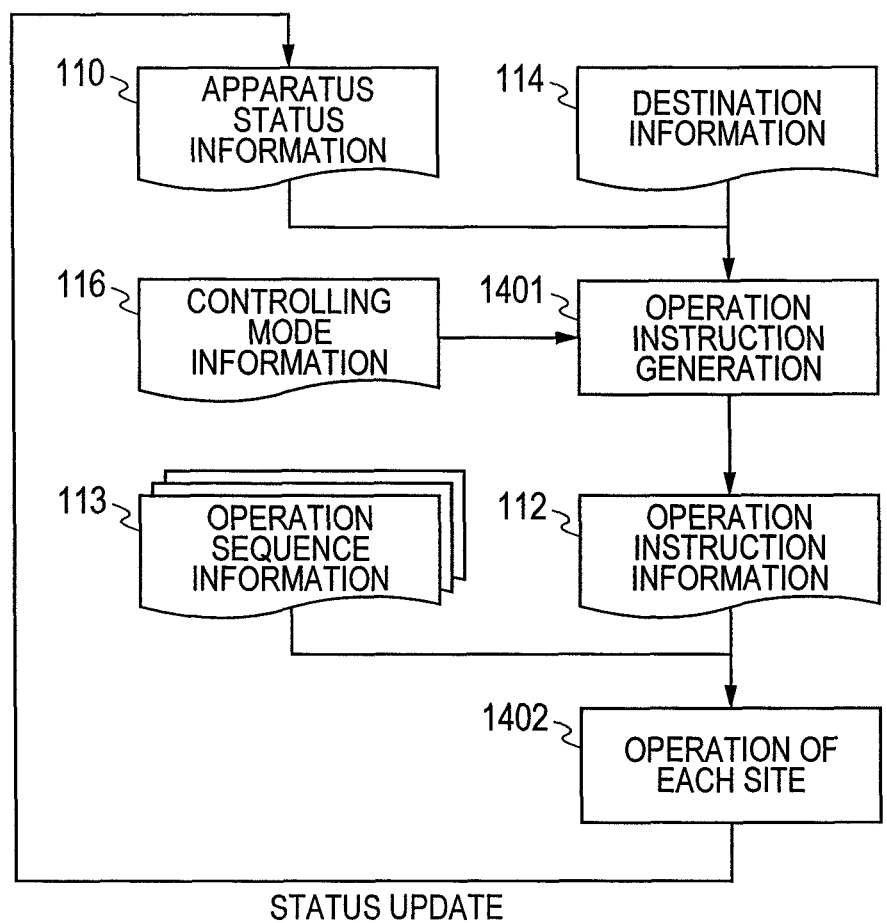
FIG. 14 is a diagram for explaining an outline of an operation execution process in the second embodiment.

Next, an operation execution process 109 in the second embodiment will be described using FIG. 14. In the operation execution process 109 shown in FIG. 1, operations of the respective sites are actually performed on the basis of the information of the operation instruction as similar to the first embodiment. The operation execution process 109 is roughly divided into two processing steps. One of two processing steps is operation instruction generation 1401. The operation instruction generation 1401 is a step of generating the operation instruction information 112 on the basis of the prepared operation instruction rule by inputting the apparatus status information 110, the destination information 114, and the controlling mode information 116. In the operation instruction generation 1401, the apparatus status information and the destination information are checked against the operation instruction rule, and the operation instruction is generated if the conditions are met, as similar to the first embodiment. Two operation instruction rules are prepared in accordance with the controlling mode in the operation instruction generation 1401 in the second embodiment. One of two operation instruction rules is an operation instruction rule in accordance with "robot high-performance mode", and the other is an operation instruction rule in accordance with "process chamber high-performance mode". With reference to the controlling mode information 116, the operation instruction rule in accordance with the controlling mode whose flag is on is selected to perform calculation.

First, the operation instruction rule in accordance with "robot high-performance mode" will be described while showing an example in FIG. 15. In the operation instruction rule, a specific rule is added so that the number of times of transferring operations to the process chambers is increased for the transport chamber located further away from the load lock. In order to increase the number of transferring operations to the transport chambers by the transport chamber located further away from the load lock, it is only necessary increase the number of unprocessed wafers for the buffer room located further away from the load lock. In order to do so, the number of unprocessed wafers held by each of the load lock and the buffer rooms is counted. In the case where the number of unprocessed wafers held by the buffer room located further away from the load lock is smaller, it is only necessary to generate the operation instruction rule in which the vacuum robot preferentially carries the wafer to the buffer room, rather than the process chamber. For example, the condition of "the number of unprocessed wafers in buffer room 212 is larger than that in load lock 211" is added to the operation instruction conditions for the operation instruction of "transferring from load lock 211 to process chamber 205". On the other hand, the condition of the number of unprocessed wafers is not added to the operation conditions for the operation instruction of "transferring from load lock 211 to buffer room 212". If the number of unprocessed wafers in the load lock 211 is larger than that in the buffer room 212, the conditions of the transferring operation to the process chamber 205 are not met, and the wafer is not transferred to the process chamber 205. In this case, if the conditions of the transferring operation to the buffer room 212 are met, the wafer is transferred to the buffer room 212. By generating the operation instruction rule, the buffer room located further away from the load lock can hold a larger number of unprocessed wafers. As a result, the transport chamber located further away from the load lock can perform the transferring operations a larger number of times.

Next, the operation instruction rule in accordance with "process chamber high-performance mode" will be described while showing an example in FIG. 16. In order to increase the operation rates of the process chambers, it is only necessary to immediately carry a new unprocessed wafer to the process chamber in which the process has been completed. Thus, if one process chamber is in the standby status and an unprocessed wafer is present, it is only necessary to generate the operation instruction rule in which the wafer is transferred to the process chamber. Further, in order to immediately carry the unprocessed wafer to the process chamber when the process of the process chamber is completed, it is necessary to place the unprocessed wafer near the process chamber. Accordingly, it is only necessary to generate the operation instruction rule in which if the number of unprocessed wafers in the buffer room is smaller the number of process chambers connected to the transport chamber located distant from the load lock relative to the buffer room, the wafer is transferred to the buffer room.

In the example of FIG. 16, the operation instruction condition of "transferring from load lock 211 to process chamber 205" is changed to conditions under which if an unprocessed wafer is present in the load lock, the vacuum robot 217 is in the standby status, and the process chamber 205 is in the standby status, the wafer is transferred to the process chamber 205. On the other hand, the operation instruction condition of "transferring from load lock 211 to buffer room 212" is changed to conditions under which if an unprocessed wafer is present in the load lock, the vacuum robot 217 is in the standby status, an available stage is present in the buffer room 212, and the number of unprocessed wafers in the buffer room 212 is 3 or smaller, the wafer is transferred to the buffer room 212. In the condition of "the number of unprocessed wafers in the buffer room 212 is 3 or smaller", the condition of "3 or smaller" is set because the number of process chambers connected to the transport chambers 215 and 216 further away from the load lock 221 relative to the buffer room 212 is 4 as the process chambers 207, 208, 209, and 210. Accordingly, it is possible to realize the operation in which a new unprocessed wafer is immediately transferred to the process chamber in which the process has been completed.

Next, the process of operation of each site 1402 as the second processing step of the operation execution process 109 will be described. This process is the same as the operation of each site 1002 in the first embodiment. Further, the screen of the console terminal 120 is the same as that in the first embodiment.

In addition, the example in which the number of wafers stored in one cassette is 25 is described in the embodiment. However, the present invention is not limited to the controlling method in the case where the number of wafers is 25. Further, the present invention is not limited to the control method in the case where the number of cassettes is 1.

What is claimed is:

1. A vacuum processing apparatus comprising:
a plurality of process chambers, wherein in a process chamber, a predetermined process is performed on a processing-target member;
a plurality of transferring mechanical units, including vacuum robots, configured to pass and receive processing-target members;
a plurality of transferring intermediate units, through which the transferring mechanical units are connected to each other, configured to relay and carry processing-target members; and
a controlling unit configured to control passing, receiving, relaying, and transferring of processing-target members;
wherein the controlling unit has a sequence determination unit; and
wherein the sequence determination unit is configured to determine a sequence of operations for transferring processing-target members to the process chambers and the transferring intermediate units;

wherein the sequence determination unit includes a control determination unit configured to determine whether the sequence of operations is determined on the basis of a processing time required for the process chambers to process processing-target members, or determined on the basis of a transferring time required for the vacuum robots to transfer processing-target members, wherein when the sequence of operations is determined on the basis of a processing time, a transferring order is determined by using a means for generating a transferring order to have a high throughput, under conditions in which processing time is prioritized, wherein when the sequence of operations is determined on the basis of a transferring time, the transferring order is determined by using a means for generating a transferring order to have a high throughput, under conditions in which transferring time is prioritized.

2. The vacuum processing apparatus according to claim 1, wherein the control determination unit is configured to determine that the sequence of operations is determined on the basis of a processing time when the processing time is greater than or equal to a switching threshold value, and alternatively, is determined on the basis of the transferring time when the processing time is less than a switching threshold value.

3. The vacuum processing apparatus according to claim 1, wherein the sequence determination unit includes a memory unit configured to store: a first controlling method configured to increase the operation rates of the transferring robots to be higher than those of the process chambers, and a second controlling method configured to increase the operation rates of the process chambers to be higher than those of the transferring robots.

4. The vacuum processing apparatus according to claim 3, further comprising:
a switching unit, the switching unit configured to switch the controlling method to one of: the first controlling method and the second controlling method, on the basis of a result obtained from the sequence determination unit.

5. The vacuum processing apparatus according to claim 1, wherein the sequence determination unit has a threshold value calculated on the basis of: the time required for a vacuum robot to replace a processing-target member in a process chamber, and a cycle time.

6. The vacuum processing apparatus according to claim 5, wherein the sequence determination unit is configured to determine a sequence of operation on the basis of the threshold value.

7. A program stored in a non-transitory medium readable by a computer, and that when executed by the computer causes the computer to function as:
a plurality of processing units, wherein in a process chamber, a predetermined process is performed on a processing-target member;
a plurality of transferring units configured to pass and carry processing-target members using transferring robots;
a plurality of transferring intermediate units, through which the transferring units are connected to each other, which are configured to relay and carry processing-target members;
a plurality of a controlling unit configured to control passing, receiving, relaying, and transferring of processing-target members; and
a sequence determination unit configured to determine a sequence of operations for transferring processing-target members to the process chambers and the transferring intermediate units;
wherein the sequence determination unit includes a control determination unit configured to determine whether the sequence of operations is determined on the basis of a processing time required for the process chambers to process processing-target members, or determined on the basis of a transferring time required for the vacuum robots to transfer processing-target members,
wherein when the sequence of operations is determined on the basis of a processing time, a transferring order is determined by using a means for generating a transferring order to have a high throughput, under conditions in which processing time is prioritized,
wherein when the sequence of operations is determined on the basis of a transferring time, the transferring order is determined by using a means for generating a transferring order to have a high throughput, under conditions in which transferring time is prioritized.

8. The vacuum processing apparatus according to claim 7, wherein the control determination unit is configured to determine that the sequence of operations is determined on the basis of a processing time when the processing time is greater than or equal to a switching threshold value, and alternatively, is determined on the basis of the transferring time when the processing time is less than a switching threshold value.

* * * * *